(12) United States Patent
Krigel

(10) Patent No.: US 6,442,498 B1
(45) Date of Patent: Aug. 27, 2002

(54) APPARATUS AND METHOD FOR DETERMINING THE INTEGRITY OF CABLES AND WIRING HARNESSES

(76) Inventor: Henrick Youval Krigel, 14326 Citation, San Antonio, TX (US) 78248

(*) Notice: Subject to any disclaimer, the term of this patent is extended or adjusted under 35 U.S.C. 154(b) by 163 days.

(21) Appl. No.: 09/595,165

(22) Filed: Jun. 15, 2000

Related U.S. Application Data

(60) Provisional application No. 60/139,226, filed on Jun. 15, 1999.

(51) Int. Cl.[7] .......................... G01R 31/02; G01R 19/25
(52) U.S. Cl. .......................... 702/108; 702/58; 324/539; 324/66
(58) Field of Search ...................... 702/58, 108; 324/66, 324/555, 539; 340/651

(56) References Cited

U.S. PATENT DOCUMENTS

| | | | |
|---|---|---|---|
| 4,689,551 A | | 8/1987 | Ryan et al. .................... 324/51 |
| 4,733,463 A | * | 3/1988 | Kolanowski et al. ........ 29/33 F |
| 4,959,792 A | * | 9/1990 | Sullivan ...................... 324/555 |
| 5,334,043 A | | 8/1994 | Dvorak, Jr. et al. ......... 439/482 |
| 5,621,600 A | | 4/1997 | Iijima .......................... 361/93.6 |
| 5,635,843 A | * | 6/1997 | Borland ....................... 324/133 |
| 5,745,975 A | * | 5/1998 | Heisner et al. ............. 29/33 M |

* cited by examiner

*Primary Examiner*—Kamini Shah
(74) *Attorney, Agent, or Firm*—Jacson Walker LLP

(57) ABSTRACT

An portable apparatus and method for troubleshooting and determining the integrity of cables and wiring harnesses requiring connection to only one end of the cable or wiring harness to be tested. A series of tests are conducted to determine the integrity of each wire within the cable or wiring harness. The data is then evaluated and compared to the data of a known good cable or wiring harness stored in a memory device or CD-ROM. The faulty cable or wiring harness, if any, are displayed along with a list of shorts or opens present between cables or between a cable and aircraft ground, and the exact distance to any detected fault.

10 Claims, 25 Drawing Sheets

Test

APPARATUS AND METHOD FOR DETERMINING THE INTEGRITY OF CABLES AND WIRING HARNESSES

CROSS REFERENCE TO RELATED APPLICATION

This application claims the benefit U.S. Provisional Application No. 60/139,226, filed Jun. 15, 1999, and entitled "Apparatus and Method for Investigating the Integrity of Cables and Wiring Harnesses."

BACKGROUND OF THE INVENTION

The present invention relates to electronic testing equipment and more particularly to a testing device used to determine the integrity of cables and wiring harnesses.

Known prior art devices used for testing cables and wiring harnesses include U.S. Pat. No. 4,689,551, U.S. Pat. No. 4,959,792, and U.S. Pat. No. 5,621,600. The testing of cables and wiring harnesses has historically been a trial and error procedure as described in the '600 patent. If a wiring problem is detected, expert technicians would typically use an ohmmeter, a device used to measure resistance between two points on a wire, to detect a wire short. To determine which wire contains the short, the technicians must test each individual wire separately. Although the shorted wire would eventually be detected, the exact location of the short along the length of the wire would be unknown.

To locate the approximate location of the short, the prior art teaches the application of an audio range A.C. signal to the suspect wire or wire pair. An inductive type sensor, susceptible to magnetic fields created by an A.C. current is then used to determine the approximate location of the short. This is done by placing the sensor against the surface of the suspect wire or wire pair. The sensor provides an auditory tone whose volume depends on the strength of the magnetic field surrounding each particular wire. The user must physically place the sensor in close proximity with the wire itself to locate the fault. When the user no longer hears the auditory tone, the sensor is either too far from the wire or the wire has ceased conducting electric current. This lack of auditory tone alerts the user to the approximate location of the short.

The above mentioned inductive sensors have used both a high and low frequency audio range signal. The '600 patent is an example of the use of a low frequency, low duty cycle signal applied directly to the suspect wire to determine the wire's integrity.

The problems associated with this method are numerous. Using an aircraft as an example, the method above usually requires the removal of panels and any on-board computers or line replaceable units (LRUs) operatively associated with the cable. The time and expense involved in having a skilled operator execute this process for an aircraft having hundreds of miles of cable and wiring harnesses within its structure is considerable.

In addition to the inefficient use of time and resources, wear and tear upon the aircraft itself becomes an issue. A single wire malfunction may require the removal of suspect cables, wiring harnesses, on-board computers and the LRUs so that each wire may be tested. This requires removal of aircraft access panels which may then be subjected to damage as well as wear and tear from repeated openings and closings.

Patents '792 and '551 improved upon this method by using an electronic unit, capable of connection to both ends of a cable or wiring harness. The unit sending electronic signals down the length of each wire and measuring the results.

The concept of sending an electronic signal or pulse down a wire to test for shorts, opens, continuity, and resistance is known in the art. Further, the use of a microprocessor and memory device to electronically store the information gained from such a procedure is also known in the art.

Under the prior art, both ends of the cable or wiring harness being tested must be attached to the testing device. This results in extra expense, time consumption, and wear and tear. A single wiring harness may extend for hundreds of feet within the aircraft structure. Portions of the harness may extend in a multitude of directions throughout the aircraft's structure. The user must locate both ends of each wire being tested, this will likely require removal of service panels and perhaps seating and cockpit instruments if the wire runs in close proximity to these items. The time and expense of locating and attaching the device to the wire is increased because both ends of each wire to be tested must be located and then made available for testing.

The present invention seeks to reduce repair time, expense, and wear and tear by allowing cables and wire harnesses to be tested and find the location of the problem without attachment of the testing device to both ends of each wire.

SUMMARY OF THE INVENTION

Accordingly, the present invention provides an automated, easy to use, windows based, portable, testing system for troubleshooting and investigating the integrity of test cables and wiring harnesses. The present invention uses a generic interface cable to connect the testing system to only one end of any cable or wiring harness to be tested. Once connected, the testing system runs a series of tests to determine the integrity of each wire within the cable or wiring harness. The data is then evaluated or compared to the data of a known good cable or wiring harness stored in a memory device or CD-ROM. The present invention displays which, if any, wires are faulty, a list of shorts or opens present between wires or between a wire and aircraft ground, and the exact distance to any detected fault.

The present invention places this information into an easy to understand visual display and also provides repair assistance information including a picture of the aircraft or other structure containing wiring. The picture displays each wire at issue and the exact position of the wire fault. The present invention further determines the resistance of a particular wire with respect to other wires or with respect to aircraft ground. The system also performs a connectivity test to determine whether a cable or wiring harness or individual wire under test is connected to a component. The present invention also provides a self-test feature which allows the internal circuitry of the testing unit itself to be checked to ensure testing reliability.

DETAILED DESCRIPTION OF THE PREFERRED EMBODIMENT

The preferred embodiment of the present invention is herein described as an apparatus used to investigate the integrity of test cables and wiring harnesses and as a method of using same. The present invention has two portions, a testing unit and a generic interface cable.

Testing Unit

Figure 1:
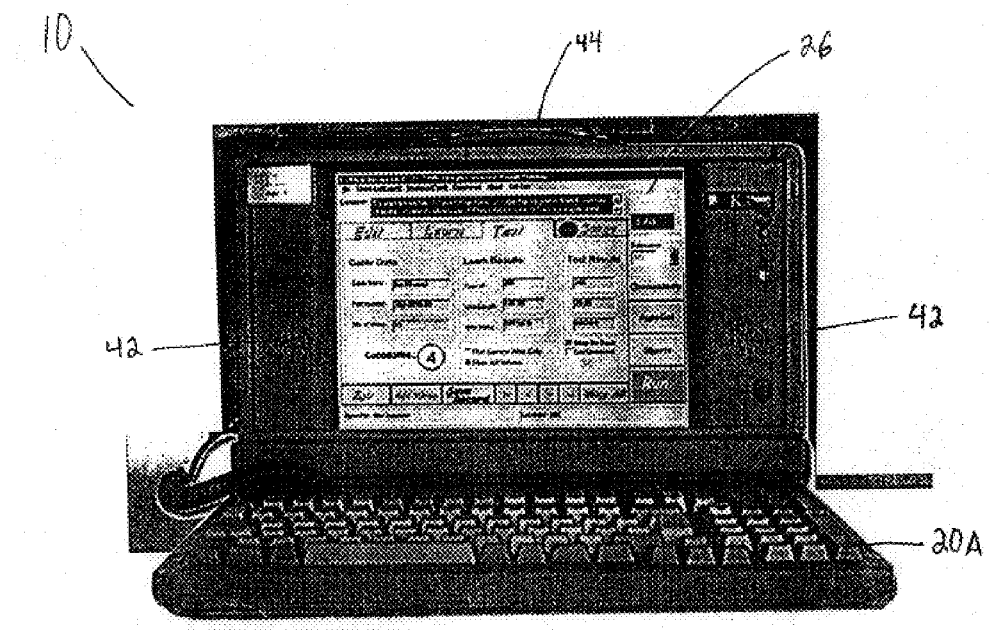
FIG. 1 is a front, elevation view of the testing unit of the present invention.

FIG. 1 illustrates the preferred embodiment of the present invention. The testing unit (10), displayed from the front in FIG. 1, uses a combination of hardware and software to investigate the integrity of test cables and wiring harnesses.

Figure 2:
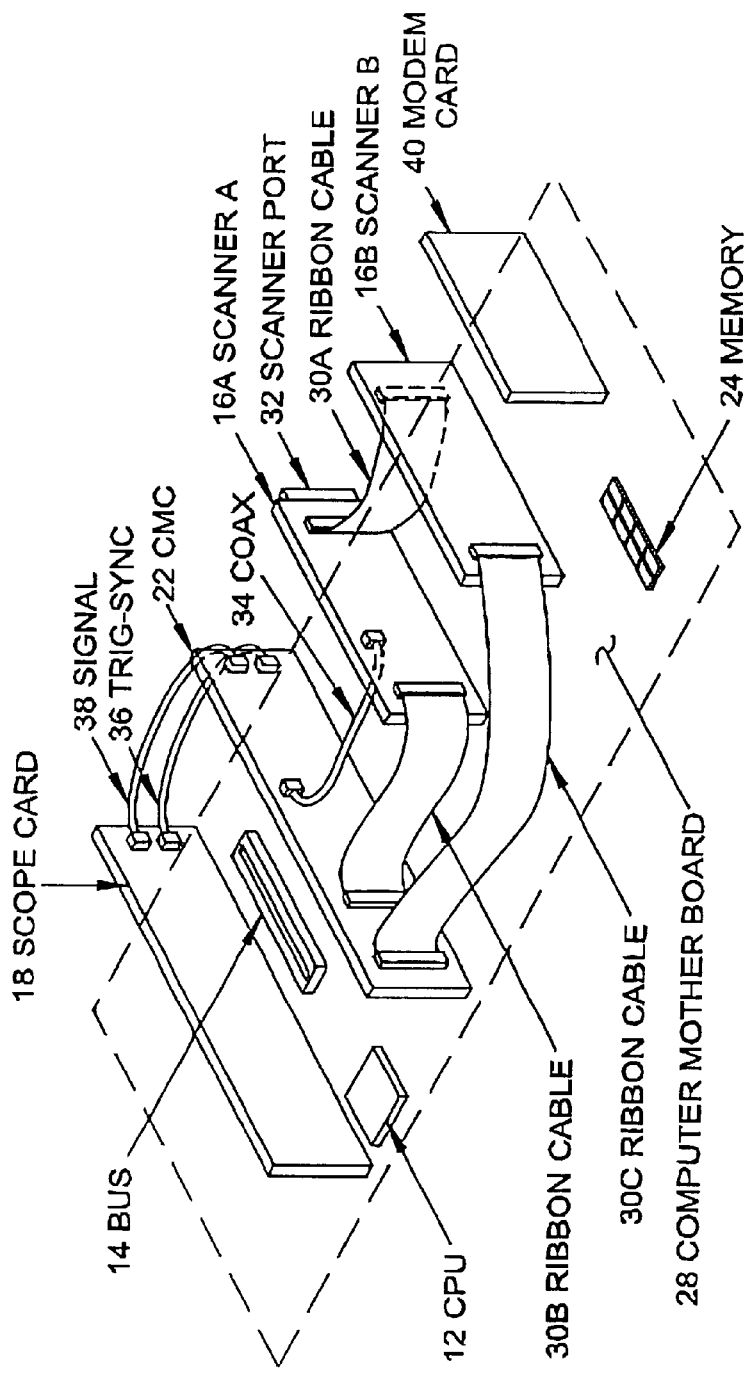
FIG. 2 is a perspective, cross-section al view of the testing unit of the present invention.

FIG. 2 illustrates the internal hardware of the testing unit (10). The hardware portion of the testing unit comprises a central processing unit (12) (CPU), at least one bus (14), at least one set of scanner cards (16), at least one scope card (18), an input source (20), at least one control/measurement card (22) (CMC), at least one memory device (24), and at least one visual display screen (26). Each component is electrically coupled to the CPU, the bus, and each of the other components via the testing unit's motherboard (28) as shown in FIG. 2.

The testing unit (10) resembles a conventional computer in that several of its components are off the shelf computer components. The CPU (12) is a standard pentium microprocessor quick enough to direct the testing unit (10) at an efficient pace. The CPU acts as the brain of the present invention by directing commands to other components through the bus (14) as instructed by the custom designed software. All CPU (12) commands are routed to the bus (14) which dispatches each command to the appropriate hardware component. The bus (14) resembles the distributor of an automobile, directing each command to the appropriate component that has the capability to carry out the requested action.

The testing unit (10) has at least one memory device (24), as illustrated in FIG. 2, that is coupled to the CPU (12). The memory device (24) is used to store data from each electronic signal sent out by the testing unit (10). This data may be both stored as an internal testing unit file or as a random access file that can be saved at the user's request. The memory device (24) is a standard off the shelf component as used in an ordinary computer system.

The testing unit (10) has an input source (20) coupled to the CPU. The input source (20) allows the user to select options displayed upon the visual display screen (26) or to enter data into the testing unit (10). The user may use the input source (20) to input previous test data that can be used to evaluate and compare testing results. The input source may be either a mouse (not shown) or a keyboard (20A).

The control/measurement card (22) (CMC) has two primary functions. First, the CMC (22) directs the set of scanner cards (16) to carry out the initiatives ordered by the custom made software. Specifically, the software decides what action to take and informs the CPU (12) via electronic signal what the requested action is. The CPU (12) then sends the request to the bus (14) which in turn sends the request to the CMC (22). The CMC (22) then orders the set of scanner cards (16) to initiate the requested action.

Second, the CMC (22) measures data received from electronic signals sent out through the set of scanner cards and subsequently reflected back to the testing unit (10). Specifically, the CMC (22) measures connectivity data, capacitance data, short data, and resistance data.

The testing unit (10) has at least one set of scanner cards (16) coupled to the CPU (12). Each set of scanner cards is coupled to the CPU (12) via the motherboard (28). Each set of scanner cards has a rail A (16A) and a rail B (16B) scanner card. Both rail A and rail B are connected to the CMC by a ribbon cable (30B and 30C, respectively). The rail A and rail B scanner cards are connected by a ribbon cable (30A) which allows both cards to be serviced by the scanner port (32). The scanner port allows both rail A (16A) and rail B (16B) scanner cards to attach to the generic interface cable (110) which is attached to cables or wiring harnesses that will be tested. Rail A (16A) and rail B (16B) have a plurality of relays, each relay able to connect to individual wires within the cables or wiring harnesses to be tested. The scanner cards are responsible for the physical sending of signals away from the testing unit (10) through the interface cable (110) and into the cables or wiring harnesses to be tested.

The scanner port (32) not only sends out signals as directed by the CMC (22), but also receives reflected signals. These reflected signals are sent to the CMC (22) from the set of scanner cards (16) via a three foot long coaxial cable (34). Connectivity data, capacitance data, short data, and resistance data is measured by the CMC (22) itself. The CMC measurements are then sent to the bus (14) and then to the CPU (12) to be analyzed and displayed by the software.

Figure 3:
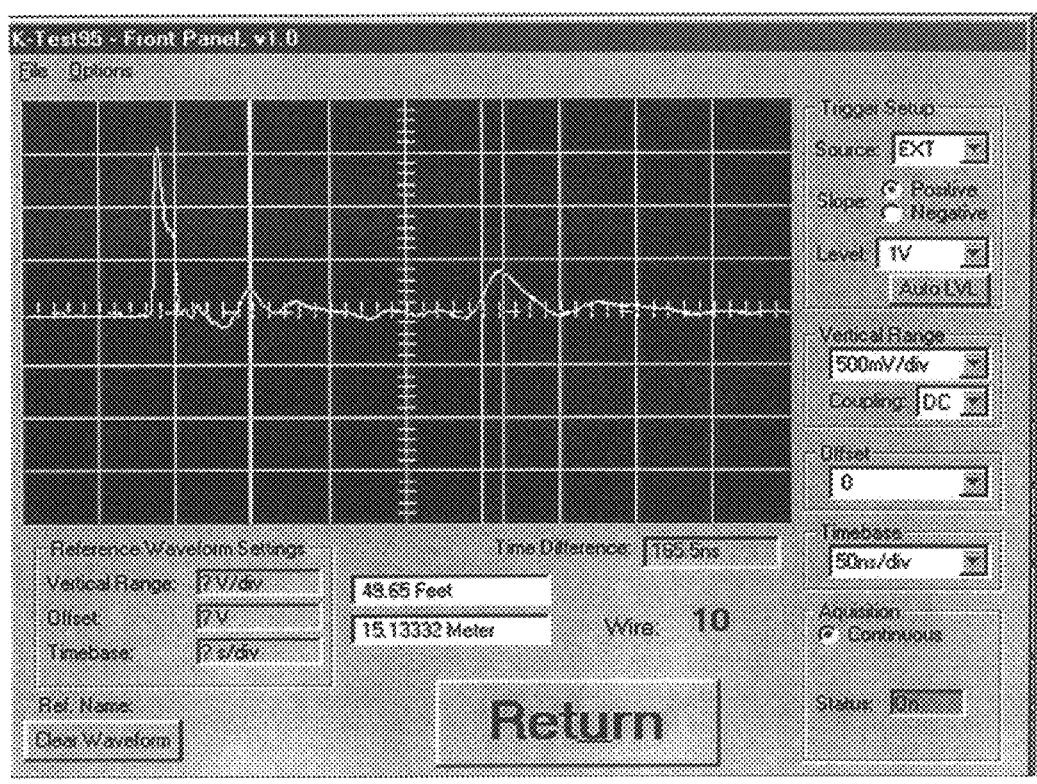
FIG. 3 is an oscilloscope readout shown upon the display screen of the present invention.

The testing unit (10) has at least one scope card (18) coupled to the CPU (12). The scope card measures all data that is not measured by the CMC (22). Specifically, the scope card (18) measures time and amplitude data. Time data and amplitude data based on the reflected signal waveforms are sent from the CMC (22) to the scope card (18) by a coaxial cable (36). The time and amplitude waveform readings of the reflected signals are then displayed upon the visual display screen (26) in an oscilloscope format, as illustrated in FIG. 3. The waveform is assured uniformity by the use of a synchronization signal which acts as a timer for the display of reflected signals upon the display screen (26). This synchronization signal is transmitted from the CMC to the scope card by a coaxial cable (38).

The testing unit (10) has at least one visual display screen (26) coupled to the CPU (12). Data accumulated from each electronic signal is measured by either the CMC (22) or the scope card (18) depending on the type of data as described above. The data is then analyzed by the software which converts the data to a user friendly digital form. The data is then arranged by the software and placed upon the visual display screen (26). The software uses a Microsoft Windows 98 operating system, this allows the user to "point and click" screen readouts for convenient review of test results.

Since the testing system is a modified computer system, the potential options for the user are numerous. Any equipment commonly used with an ordinary computer can be used with the testing unit. For example, the testing unit may be equipped with a modem card (40). The testing system may then be connected with outside users via e-mail and the internet. Test files may be downloaded or uploaded. The versatility of the testing unit is further demonstrated with the use of a camera attachment (not shown). A camera attachment may be used with the testing unit (10) to provide the user with pictures. These pictures can be used to keep visual maintenance records of each test conducted. Camera attachment may also be used for video conferencing between repair stations and remote locations.

The testing unit (10) can be equipped with a speaker system (42) to provide the user with audio manifestations. For example, when the specified number of wires have been learned and/or tested the testing unit (10) can provide the user with an audio sound to represent the completion of the cycle.

The testing unit (10) is designed to be convenient for any user. With a weight of about twenty five pounds, the testing unit (10) is portable and can be used by any user no matter his or her physical size. The testing unit also includes a handle (44) for easy carrying. The testing unit can be set up to virtually any test cable or wiring harnesses by following a few simple directions provided in the user's manual.

The Interface Cable

Figure 4:
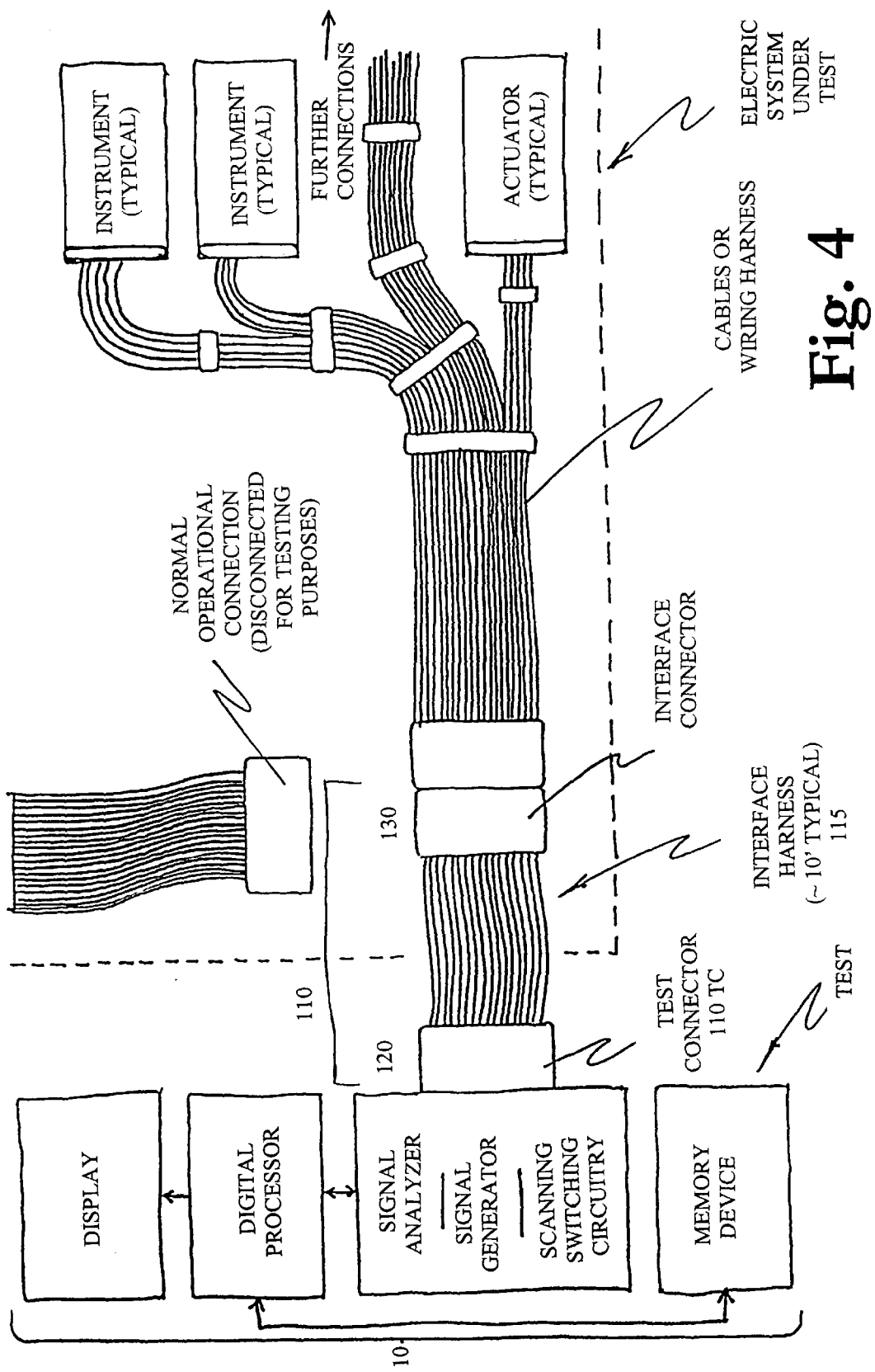
FIG. 4 is a side, elevation view showing the attachment of the interface cable of the present invention.

The present invention has a generic interface cable (110) as shown in FIG. 4. The interface cable has a first end (120), a second end (130), and an interface harness (115) extending the entire length of the interface cable (110). The first end of the interface cable has a test connector (110TC) attached. The test connector is the portion of the interface cable (110) that attaches directly to the testing unit (10) at the scanner port (32), illustrated in FIG. 2. This attachment at the scanner port (32) allows the interface cable (110) to connect the individual wires being learned and/or tested to the relays contained in rail A (16A) and rail B (16B) scanner cards.

The interface connector (110IC) is the portion of the interface cable (110) that is attached directly to the cables or wiring harnesses to be learned and/or tested. The interface connector of the interface cable can have a generic pin setup, a custom designed pin arrangement to fit any cables or wiring harness, or an open-ended setup terminated with connector pins. The open-ended setup allows the interface connector to be attached to virtually any cable or wiring harness with the simple attachment of either male or female connector pins.

The hardware and software of the present invention allows the user to test a cable or wiring harness by connecting the interface connector (110IC) to only one end of the desired testing cable or wiring harness. Eliminating the need to locate and prepare both ends of a test wire. This feature provides several advantages over conventional testing methods. Using an aircraft as an example, the present invention would allow a reduction in the time that an aircraft is grounded, a reduction in repair time, an increased readiness for on-time delivery, and a reduction in wear and tear upon aircraft components.

The Operation of the Preferred Embodiment of the Present Invention

The present invention can be attached to cables or wiring harnesses so that each individual wire is being constantly and continuously monitored. This ability of the present invention to provide continuous monitoring alleviates the "no fault found" situation. The "no fault found" situation is where a wiring problem is encountered during flight but can not be discovered upon inspection once the aircraft is on the ground. The present invention can provide repair crews with the exact time, nature, and location of the fault due to the present invention's ability to send continuous pulses through the cables and wiring harnesses. This information is stored such that a record is kept of any anomalies present in the cables or wiring harnesses at any particular time.

The preferred embodiment of the present invention identifies a faulty wire, determines if the faulty wire is open or shorted, displays the exact distance to the fault, and graphically displays the exact location of the fault upon the display screen. This is accomplished with the use of novel software which directs the hardware to conduct a series of tests upon a cable or wiring harness.

Autoset

Figure 5A:
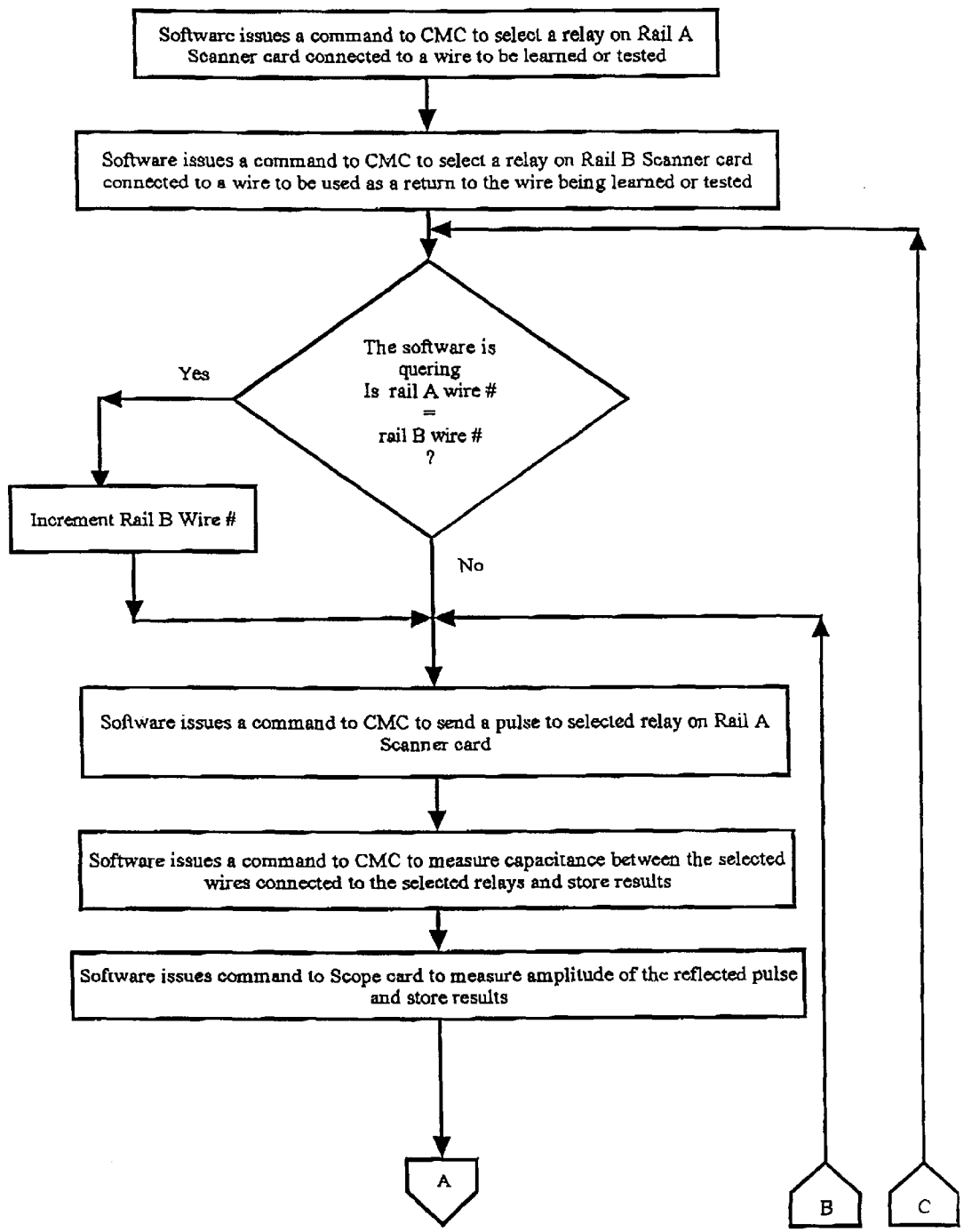
FIG. 5A and FIG. 5B is a flowchart illustrating the steps of the autoset process of the present invention.
Figure 5B:
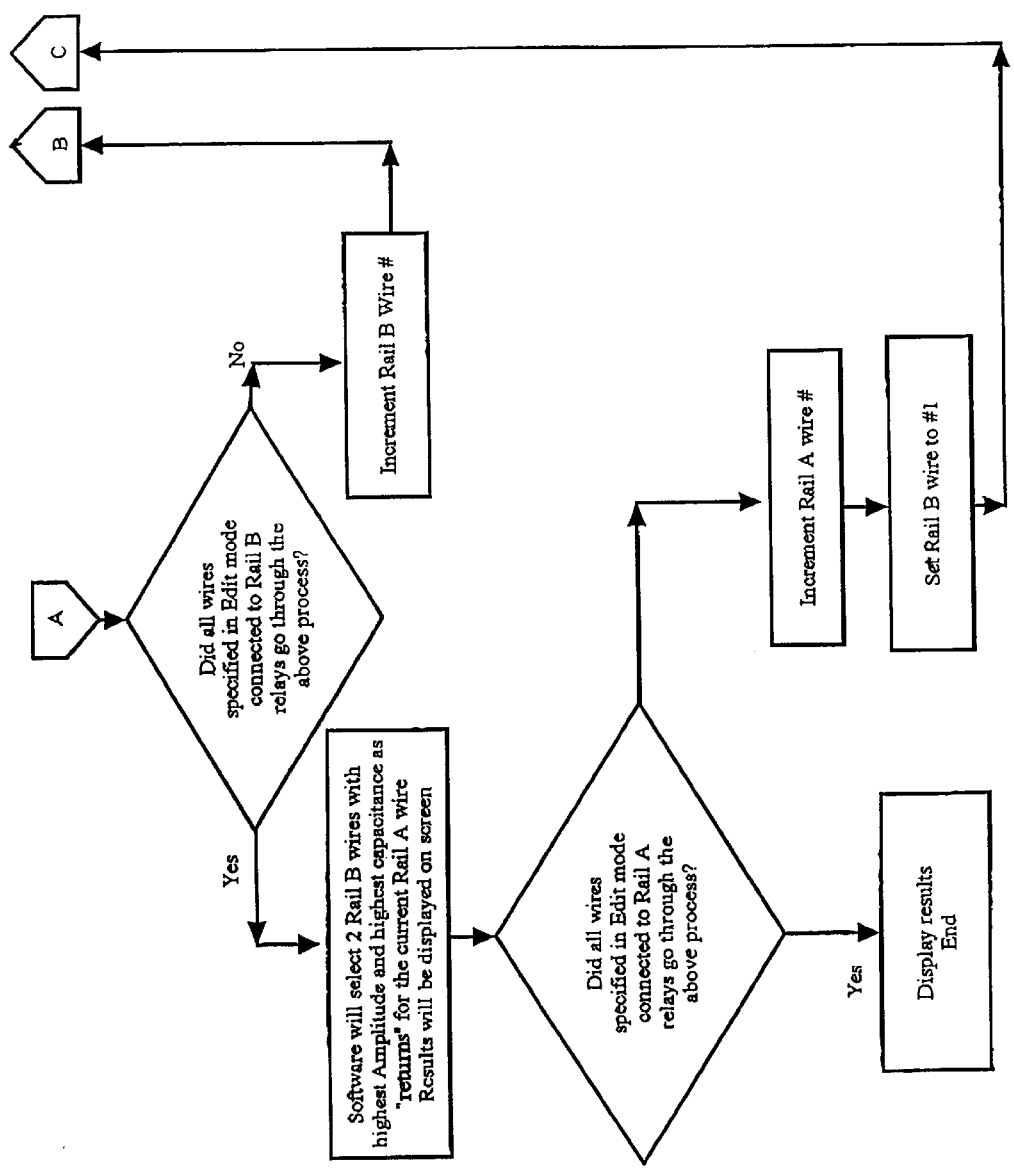

The first of these tests is the autoset process. A flowchart illustrating this process is shown in FIG. 5. Wiring harnesses may contain wires of the same length or of different lengths. The present invention is capable of measuring the length of each wire by assigning one or more reference wires to be used as a "return" for the wire under test. The software directs the hardware to select the return wires based on capacitance measurements between the wires and amplitude measurements of the reflected or return pulse. Wires which run closer to the test wire are the best candidates to be used a return.

The present invention measures capacitance between the wire under test and every other wire in the harness. A wire running in close proximity to the wire under test for its entire length will show a higher capacitance than a wire running in close proximity to the wire under test for a shorter length. In addition, a wire running in close proximity to the wire under test will show a higher capacitance than a wire running further away from the wire under test.

In addition to measuring capacitance, the present invention sends a pulse through the wire under test using one previously selected return at a time. The final selection of the best return wire among the potential return wires is based upon the highest amplitude of the returned pulse. The return wire to be used can also be selected manually by the user through an input device (20).

Referring to FIG. 4, the selection of the best suited return wire is accomplished via the following process called "autoset". First, the cables and wiring harnesses to be tested are attached to the interface connector (110IC) located on the second end (130) of the interface cable (110). Second, the test connector (110TC) located on the first end (120) of the interface cable is attached to the scanner port (32) of the testing unit (10). Third, the testing unit (10) is activated so that it is ready to send signals down the cable or wiring harnesses. Fourth, a relay on the rail A (16A) scanner card connected to a wire to be learned/tested is selected by the CMC (22) as instructed by the software.

Fifth, a relay on the rail B (16B) scanner card connected to a wire to be learned/tested is selected by the CMC (22) as instructed by the software. Sixth, the software asks whether the rail B wire selected as a return is the same wire as the wire selected for testing on Rail A (16A). If they are the same the software will direct the CMC (22) to increment the wire selected on Rail B (16B) by one. Seventh, the software directs the CMC (22) to direct the rail A (16A) scanner card to send an electronic pulse through the selected wire. Eighth, the capacitance between the selected wire on rail A (16A) and the wire selected on rail B (16B) is measured by the CMC. Ninth, the capacitance data is stored within the memory device (24).

Tenth, the amplitude or strength of the reflected electronic pulse on rail A is measured by the scope card (18). Eleventh, the amplitude data from the reflected pulse on rail A (16A) is stored within the memory device (24). Twelfth, steps four through ten are repeated until each of the plurality of relays on scanner card rail B (16B) have conducted an electronic pulse. Thirteenth, the software assigns the two rail B (16B) relays that have the highest amplitude and highest capacitance with respect to the wire to be tested as return wires.

Figure 6:
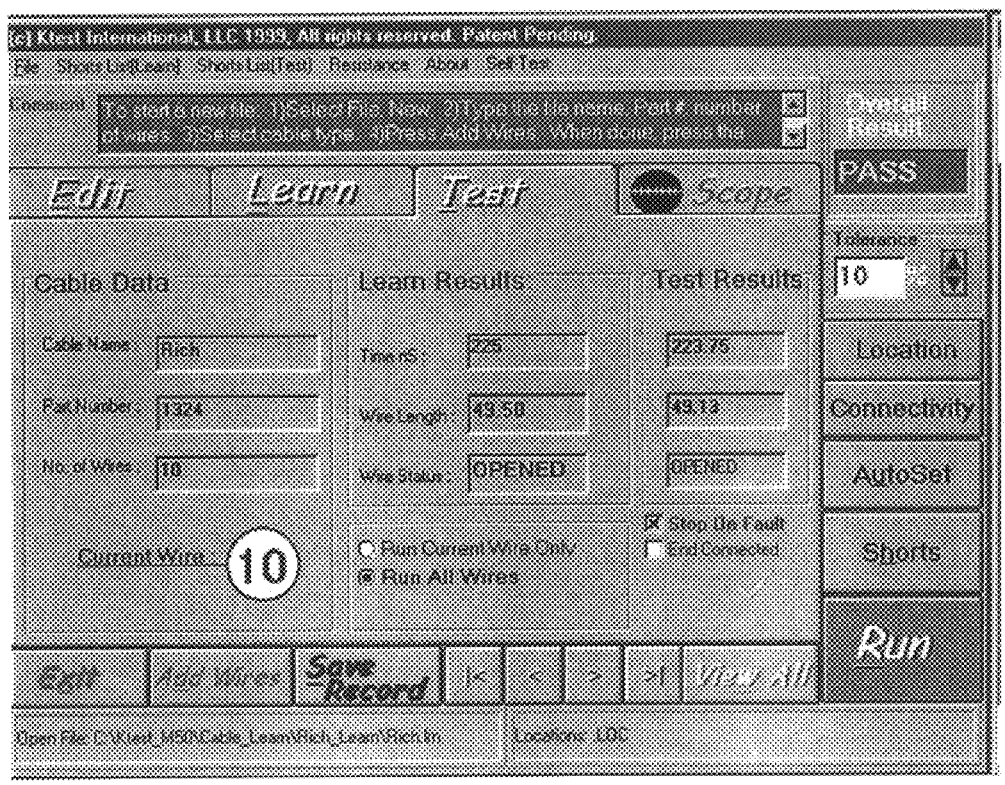
FIG. 6 is the test screen shown upon the display screen of the present invention.

Fourteenth, steps four through thirteen are repeated until each of the plurality of relays on rail A (16A) have been assigned a return relay. Fifteenth, each assignment of rail B (16B) relays as returns for each of the rail A (16A) relays is displayed upon the display screen (26). Sixteenth, an electronic signal used for testing is sent through rail A (16A) to obtain a test reading in the testing unit (10). The test reading obtained is selected from the group consisting of learn, test, connectivity learn, connectivity test, ohmmeter test, shorts learn, and shorts test. An autoset button, as shown in FIG. 6, can be clicked upon by the user to initiate the autoset process.

Learn

Figure 7:
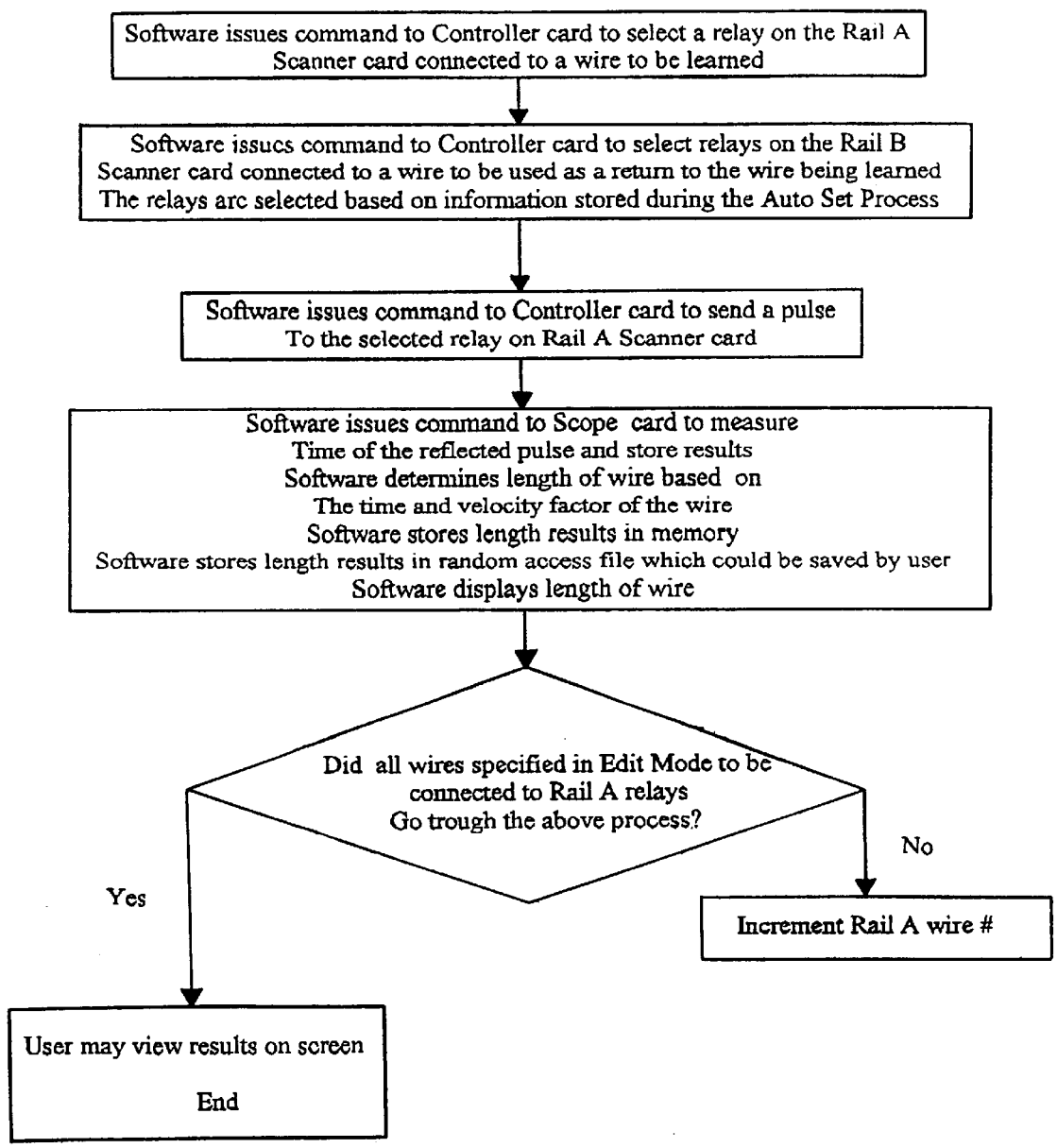
FIG. 7 is a flowchart illustrating the steps of the learn process of the present invention.

The optimal operation of the present invention occurs when the learned process is initiated. A flowchart of this process is illustrated in FIG. 7. The learn process represents the sending of signals through the wires connected to rail A (16A) scanner card for the purpose of learning the characteristics of the wires so that each wire learned may be used as a reference wire for wires tested subsequently.

To learn a wire, the present invention initiates the following steps as shown in FIG. 7. First, the software directs the CMC (22) to select a relay on rail A (16A) connected to a wire to be learned. Second, the software directs the CMC (22) to select a relay on rail B (16B) scanner card connected to a wire to be used as a return wire. The selection is based on information stored in the memory device (24) during the autoset process. Third, the software directs the CMC (22) to send an electronic pulse to the selected relay on rail A (16A).

Fourth, the software directs the scope card (18) to measure the time of the reflected pulse and store the results. "Time" refers to the number of nanoseconds that pass before the pulse is reflected to the rail A (16A) scanner card. This time, along with the velocity factor, is used by the software to determine the length of the wire being learned. Each wire within a harness has a unique velocity factor. This is the velocity at which a signal can be transmitted down the length of a particular wire. The velocity factor is determined by the dielectric material between the wire under test and the return wire selected during the autoset process. Length identification is carried out according to established techniques for time domain reflectometry (TDR) measurements.

Figure 8:
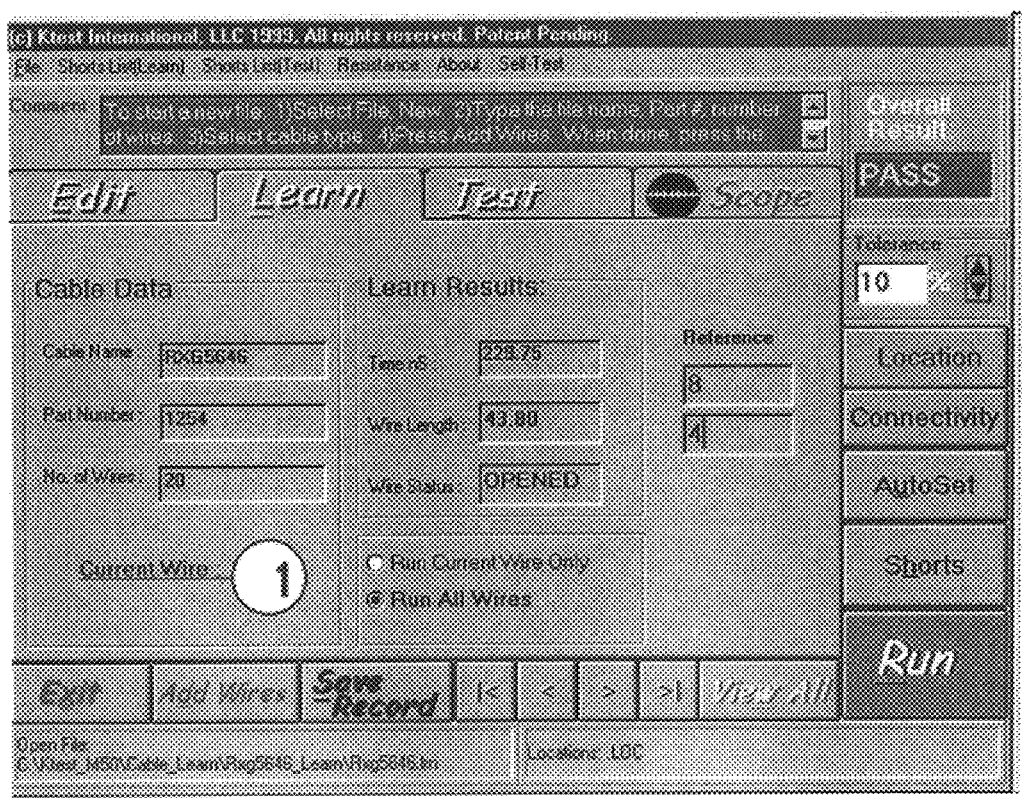
FIG. 8 is the learn screen shown upon the display screen of the present invention.
Figure 11:
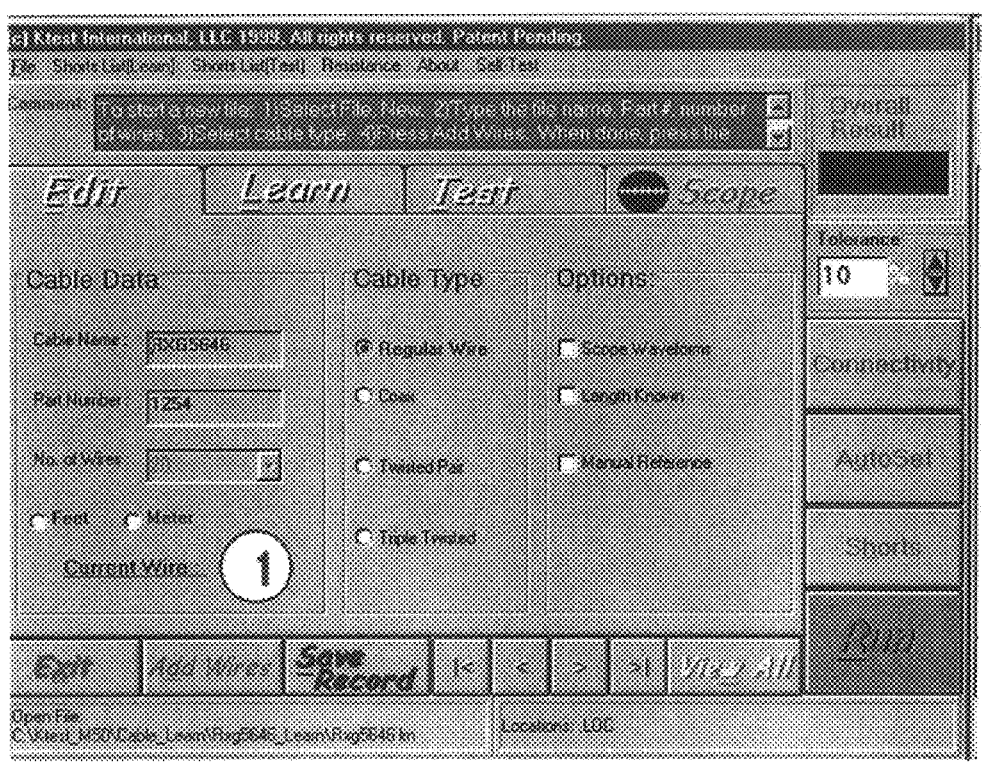
FIG. 11 is the edit screen shown upon the display screen of the present invention.

Fifth, the length is calculated and stored in the memory device (24) and/or saved by the user in a random access file (not shown). Sixth, the software displays the length of each learned wire upon the display screen (26) to be used as a reference for subsequent testing. This process is repeated until every wire in the rail A (16A) relay or every wire in rail A specified by the user while using the Edit mode, as shown in FIG. 11, of the present invention is learned. FIG. 8 represents the learn screen as placed upon the display screen (26) by the software.

The present invention also allows the user to manually input known lengths of wire being tested as shown in FIG. 11. The testing unit then calculates the velocity factor for each wire within the harness. This data is then used as a reference for subsequent testing of the same harness. The results of each learn process may be stored in the memory device (24), a random access file, a floppy disk, or in a CD-ROM. Alternatively, the data to be used as a reference may be obtained from other reference material such as written technical wiring diagrams or electronic database storage media containing the wiring information. In this alternate embodiment, the reference data can be manually entered into the system or may be electronically downloaded into the system. This embodiment has the benefit of reducing the amount of time needed to learn the data. The present invention allows the use of learned data as a reference point for testing the same cables or wiring harnesses at any time. An entire aircraft or other wired structure could be learned by the present invention so that any future problems could be tested with the aid of reference data previously shown to be accurate.

Test

Figure 10:
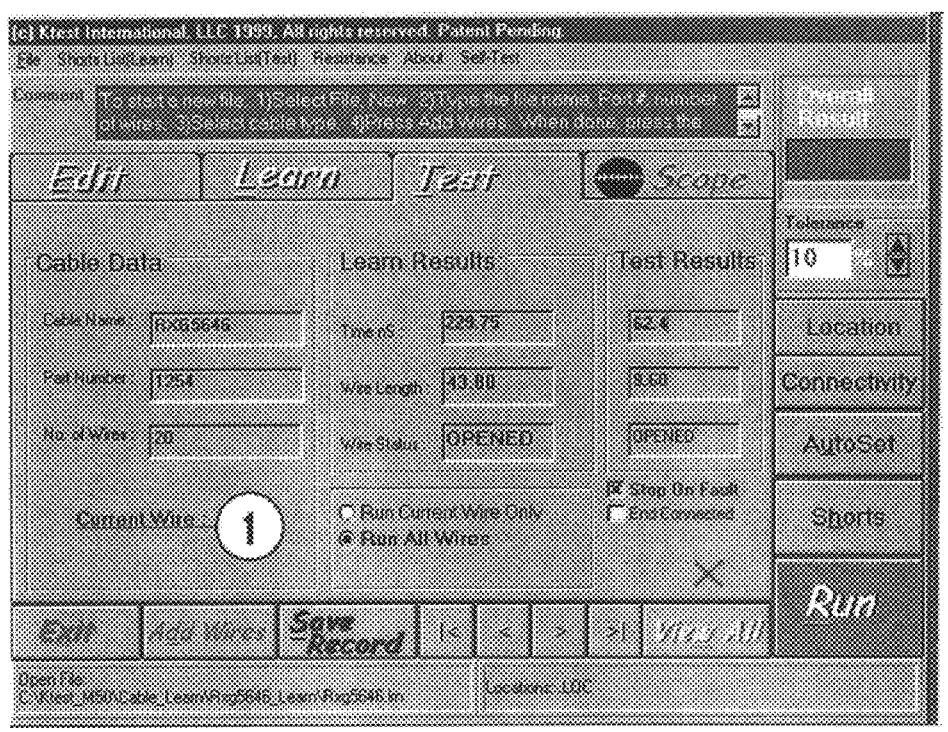
FIG. 10 i s the test screen shown upon the display screen of the present invention.

If the length of the wire under test is shorter than expected, the test system will display the discrepancy between the expected length and the actual length upon the display screen (26). Referring to FIG. 10, if the "end connected" feature shown on the test screen is selected by the user, the software will disregard and pass a particular wire whose length is determined by the test process to be greater than the length determined during the learn process. This is because a wire that is connected at its end may provide a greater length reading due to the movement of the electronic signal within the component that the wire is connected to.

Figure 9:
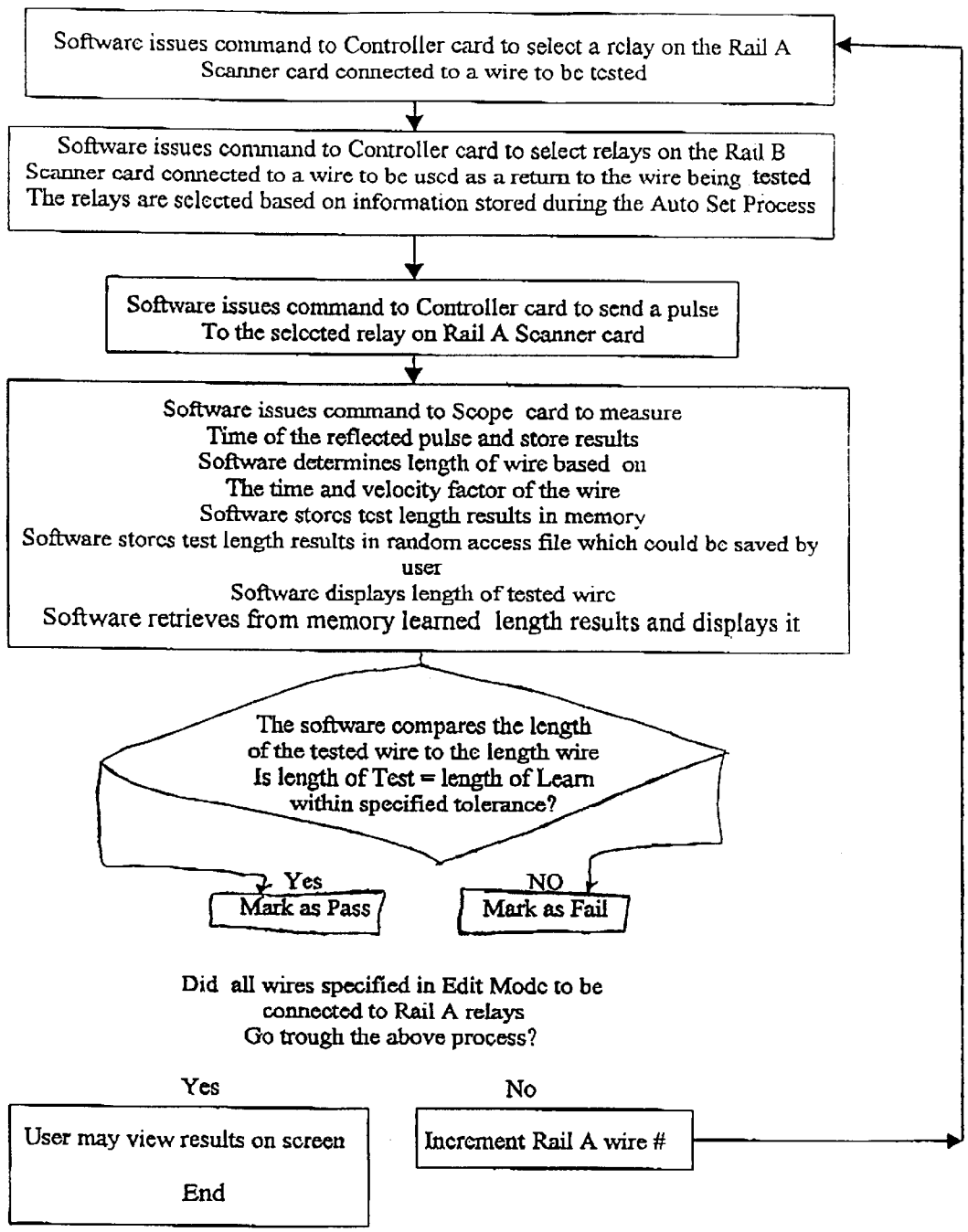
FIG. 9 is a flowchart illustrating the steps of the test process of the present invention.

Once the length of a harness is learned and stored for reference, the present invention can compare the length of wires under test to the expected length. A flowchart illustrating the test process is shown in FIG. 9.

First, the software directs the CMC (22) to select a relay on rail A (16A) connected to a wire to be tested. Second, the software directs the CMC (22) to select relays on rail B (16B) scanner card connected to a wire to be used as a return wire. The selection is based on information stored in the memory device (24) during the autoset process. Third, the software directs the CMC (22) to send an electronic pulse to the selected relay on rail A (16A).

Fourth, the software directs the scope card (18) to measure the time of the reflected pulse and store the results. Fifth, the length is calculated and stored in the memory device (24) and/or saved by the user in a random access file. Sixth, the software displays the length of each tested wire upon the display screen (26). Seventh, the software retrieves the learned length results from the memory device (24) and displays it upon the display screen. Eighth, the software compares the length measured during the learn process against the length measured during the test process.

Ninth, the software asks if the test data is equal to the learn data or within the specified tolerance. The user can insert a tolerance percentage, as illustrated in FIG. 10, via the input device (20). If the user puts in ten percent tolerance, the software will pass a tested wire whose length falls within ten percent of the learned length. This process is repeated until every wire in the rail A (16A) relay or every wire in relay A specified by the user while using the Edit mode of the present invention is tested and compared to the learned results.

Tenth, the software will display "pass" upon the display screen (26) if the test results for the particular wire are equal to or within tolerance of the learned results. This process is repeated until every wire in the rail A (16A) relay or every wire in relay A specified by the user while using the Edit mode of the present invention is learned. The edit mode display screen is illustrated in FIG. 11.

Connectivity Learn/Test

Figure 12A:
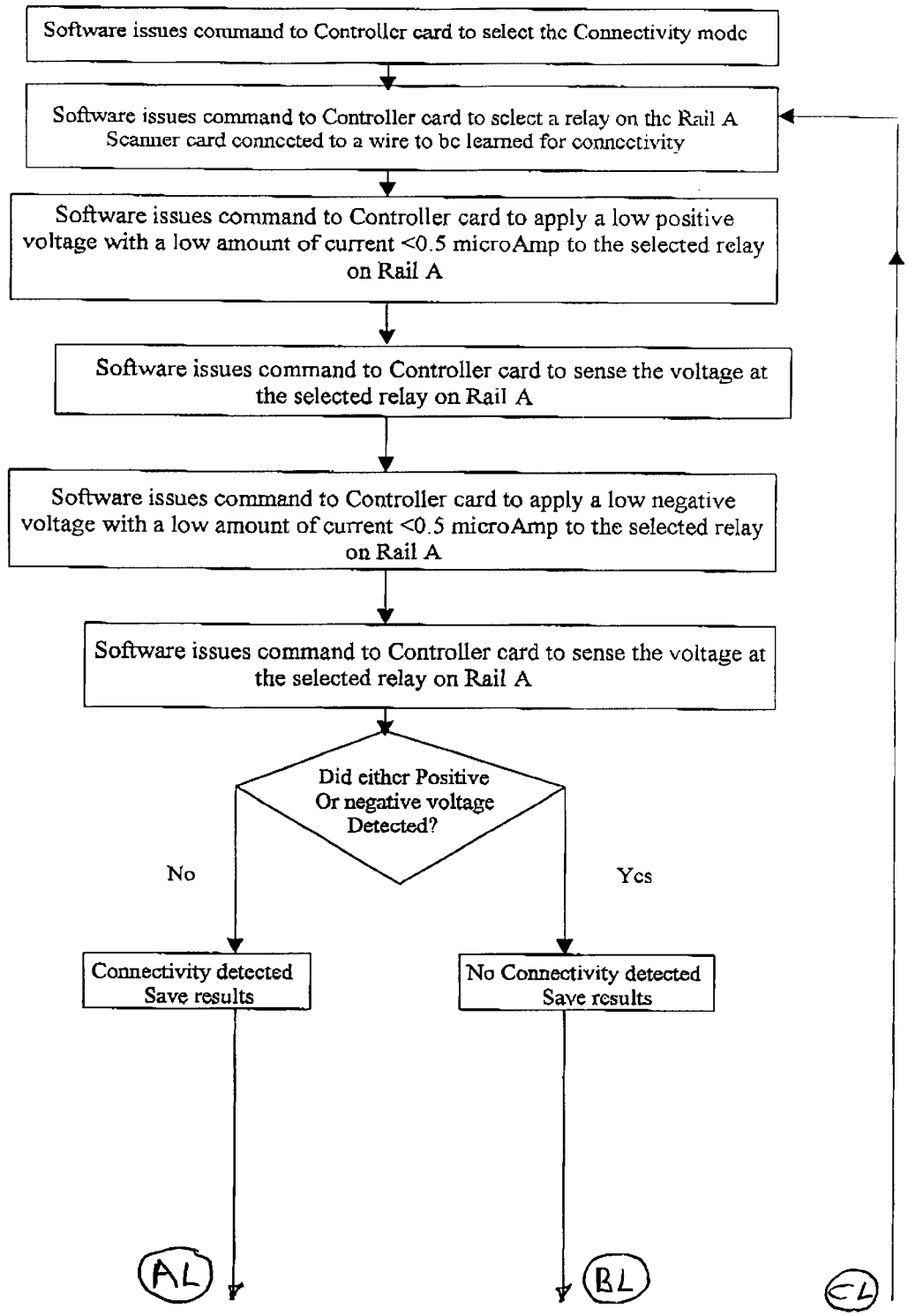
FIG. 12A and FIG. 12B is a flowchart illustrating the steps of the connectivity learn process of the present invention.
Figure 12B:
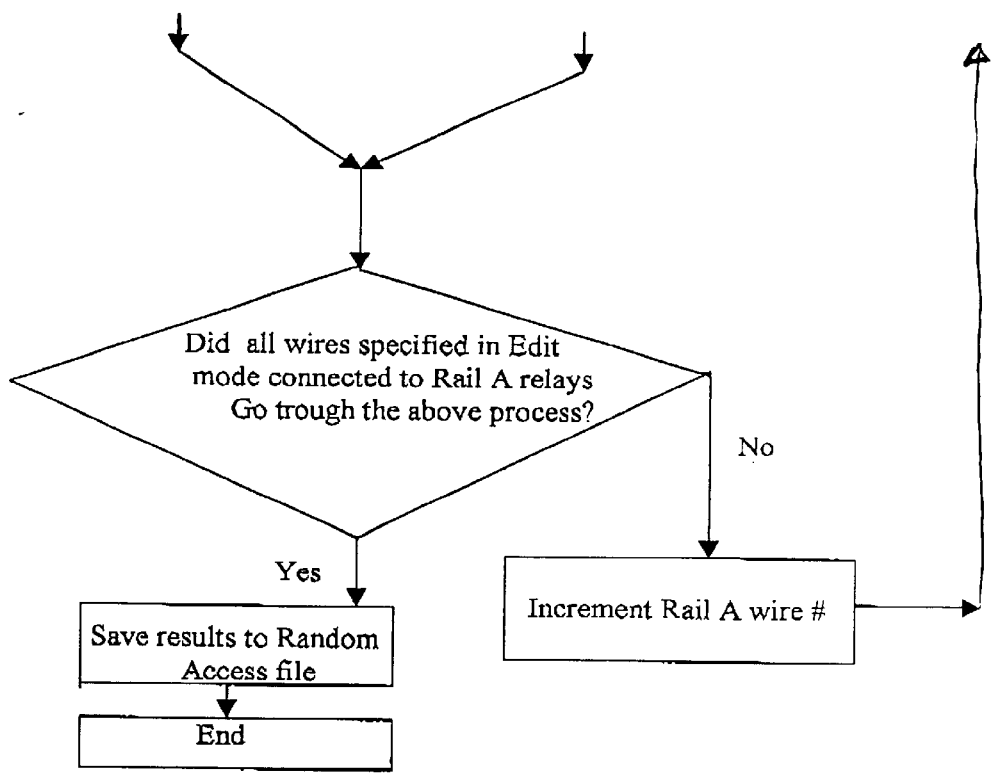

A flowchart illustrating the connectivity learn process is shown in FIG. 12. The present invention is capable of detecting a broken pin in a connector at the distal end of the harness. In such a case, the wire length is read to be correct, but the harness is still faulty. To test for such a condition, the distal end of the harness remains connected.

The present invention performs a connectivity/learn process which provides reference data for comparison to subsequent tests performed. The connectivity/learn process includes the following steps. First, the software directs the CMC to select the connectivity mode. Second, the software directs the CMC (22) to select a relay on the rail A (16A) scanner card connected to a wire to be learned for connectivity.

Third, the software directs the CMC (22) to apply a low positive voltage with a low amount of current (<0.5 micro ampere) to the selected relay on Rail A (16A). Fourth, the software directs the CMC (22) to measure (sense) the voltage returned to rail A (16A). Fifth, the software directs the CMC (22) to apply a low negative voltage with a low amount of current (<0.5 micro ampere) to the selected relay on Rail A (16A). Sixth, the software directs the CMC (22) to measure (sense) the voltage at selected rail A (16A). Seventh, if either positive or negative voltage is measured by the CMC (22), the software will conclude no connectivity and store the results in the memory device (24). This process is repeated until every wire in the rail A (16A) relay or every wire in relay A specified by the user while using the Edit mode of the present invention is connectivity learned.

Figure 13A:
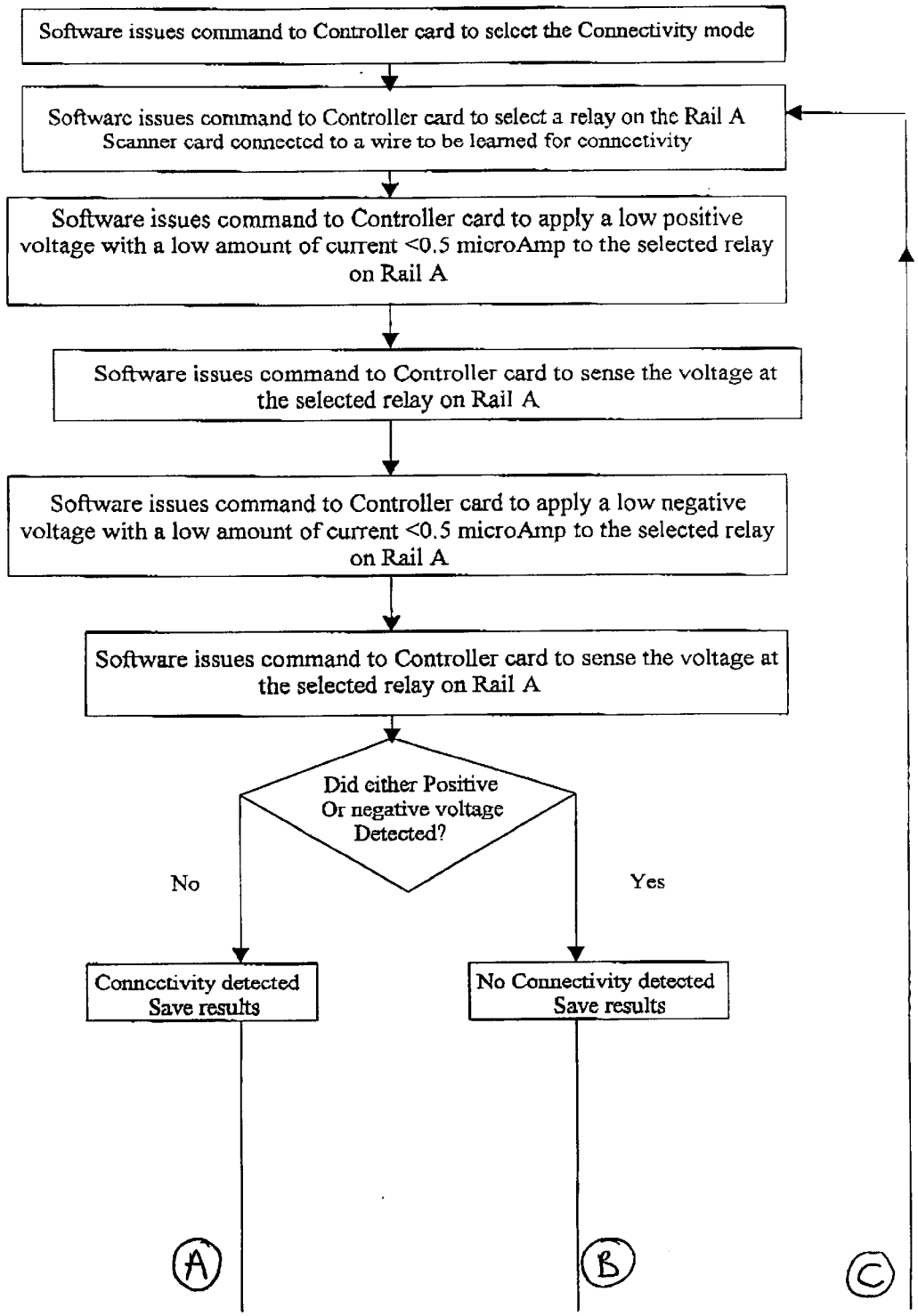
FIG. 13A and FIG. 13B is a flowchart illustrating the steps of the connectivity test process of the present invention.
Figure 13B:
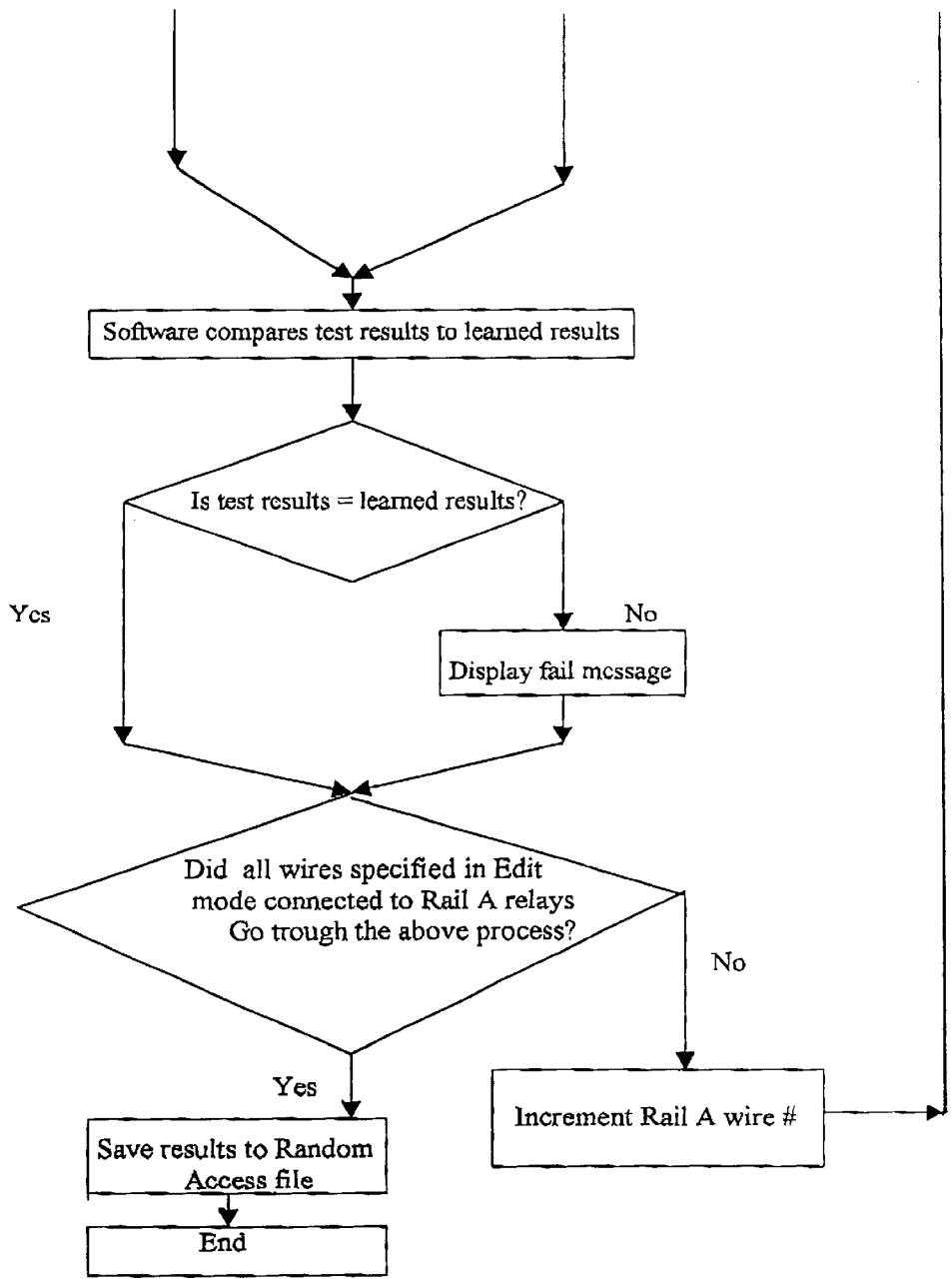

A flowchart illustrating the connectivity test process is shown in FIG. 13. The connectivity/test process is identical to the connectivity/learn process except that the test results are compared to the stored data from the connectivity/learn process. The connectivity/test process also includes the following additional steps. If the data gained from the connectivity/test is equal to the connectivity/learned data, the software displays a "pass" message upon the display screen. If the data gained from the connectivity/test is not equal to the connectivity/learned data, the software displays a "fail" message upon the display screen. A connectivity button, as illustrated in FIG. 8, can be clicked upon to initiate both connectivity processes.

Ohmmeter Test

Figure 14:
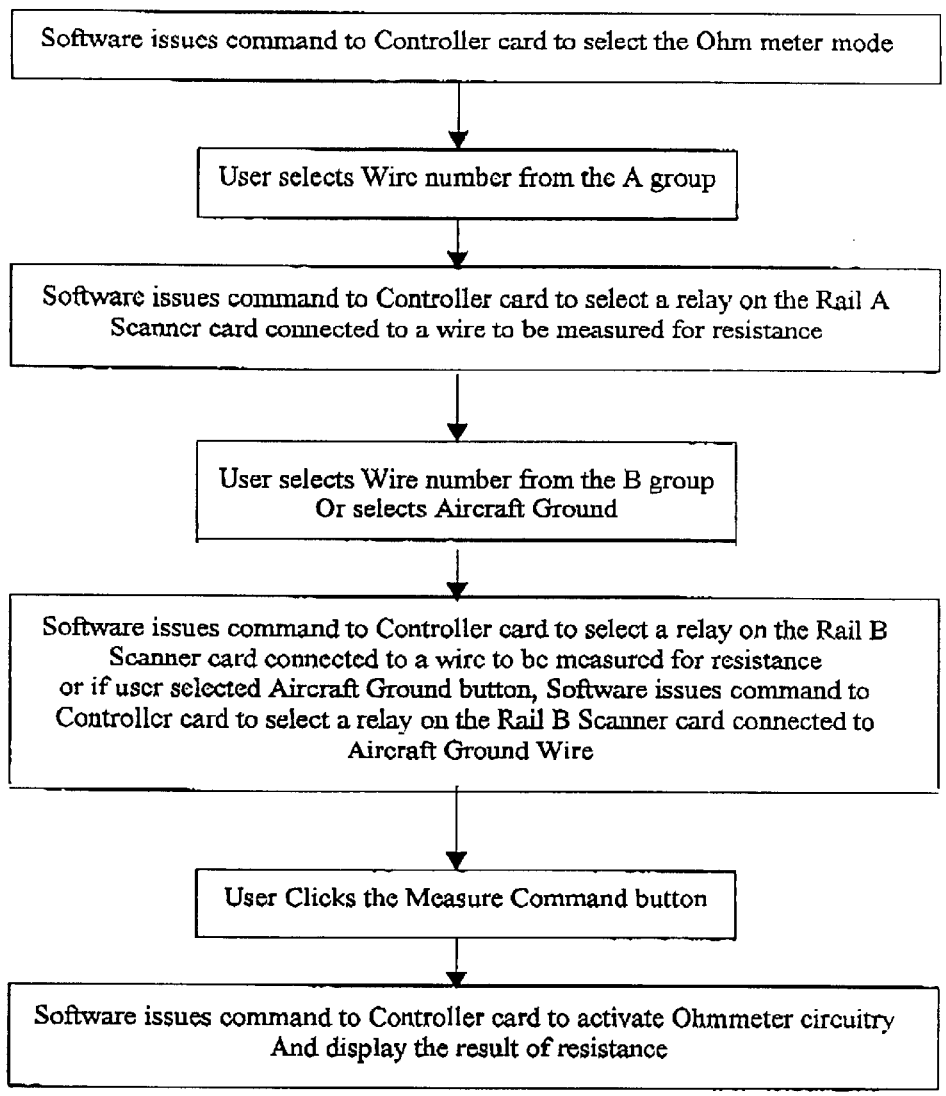
FIG. 14 is a flowchart illustrating the steps of the ohmmeter test process of the present invention.

A flowchart illustrating this process is shown in FIG. 14. The ohmmeter test allows the resistance of a wire with respect to another wire or with respect to ground to be checked. This function is especially useful for reading through motors, actuators, and other components with resistive properties.

Figure 15:
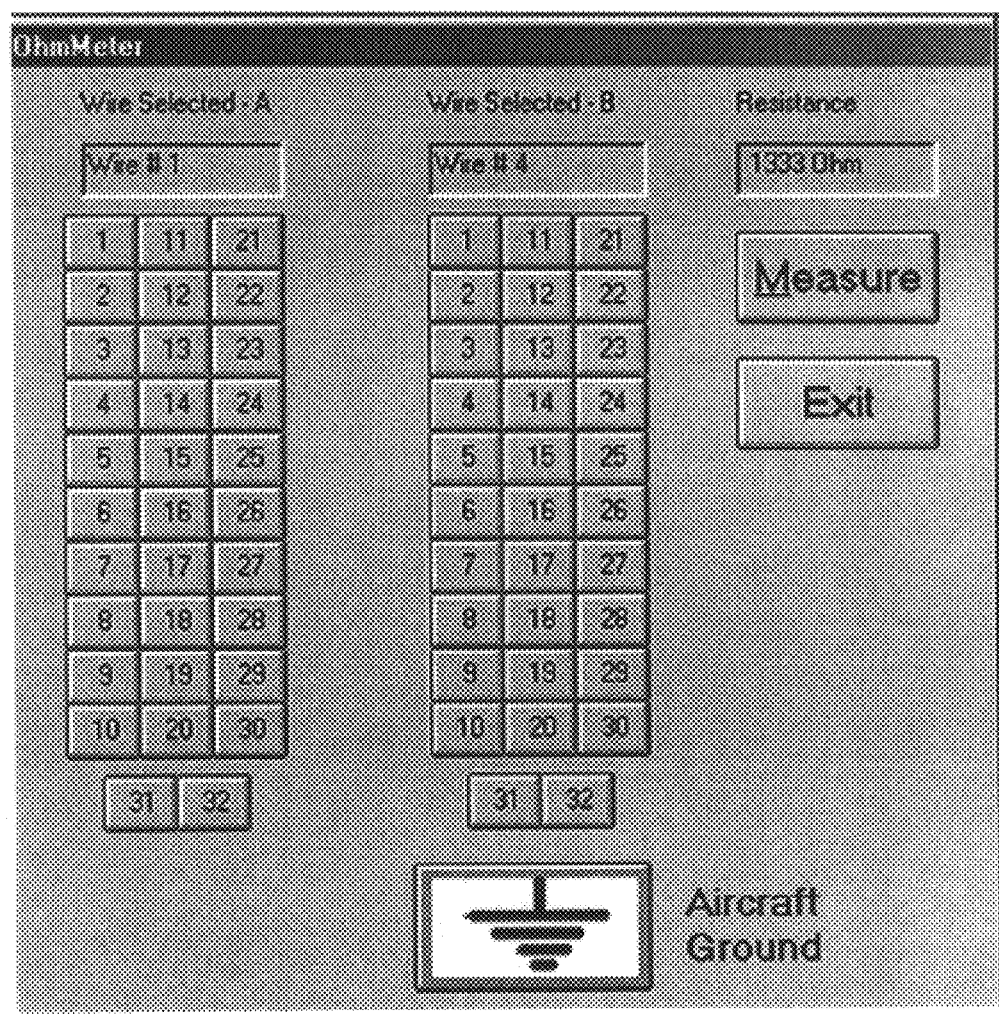
FIG. 15 is the ohmmeter screen shown upon the display screen of the present invention.

Referring the FIG. 14, the ohmmeter test has the following steps. First the software directs the CMC to select the ohmmeter mode. Second, the user selects a first wire number from the A group column on the Ohmmeter screen, illustrated in FIG. 15. Third, the software directs the CMC to select a relay on rail A scanner card connected to a wire to be measured for resistance. Fourth, the user selects a wire number from the B group column on the ohmmeter screen or the user selects the aircraft ground button on the ohmmeter screen.

Fifth, the software directs the CMC to select a relay on rail B connected to a wire to be measured for resistance or if user selected aircraft ground the software directs the CMC to select a relay on rail B scanner card connected to aircraft ground wire. Sixth, when the user clicks on the measure command button on the ohmmeter screen, the software directs the CMC to activate ohmmeter circuitry and display the resistance result upon the display screen.

Shorts/Learn and Shorts/Test

The shorts/learn process provides for the "learning" of a cable or wiring harness regarding the presence of a short. A flowchart illustrating the shorts/learn process is shown in FIG. 16.

Figure 16A:
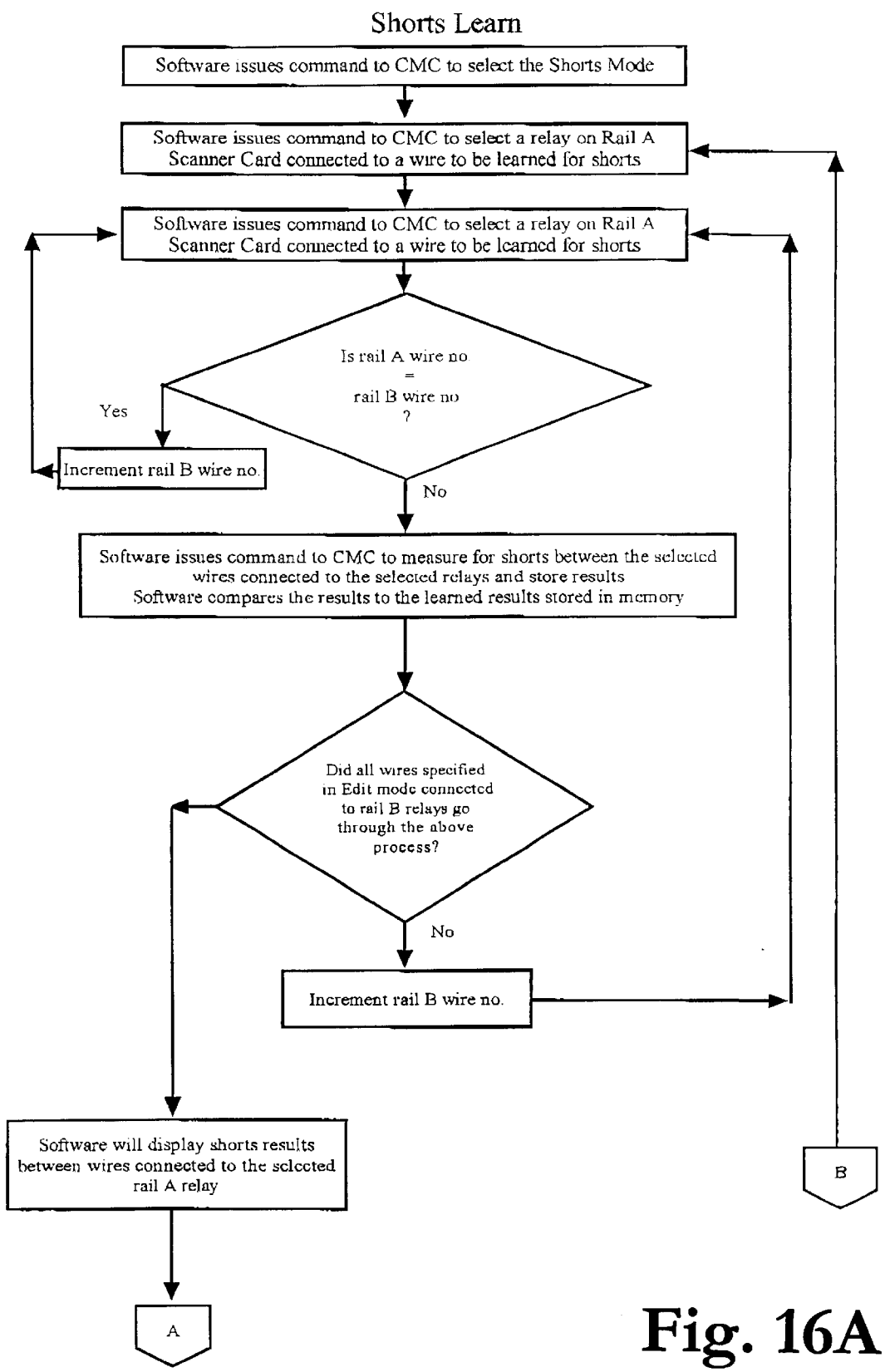
FIG. 16A and FIG. 16B is a flowchart illustrating the steps of the shorts learn process of the present invention.
Figure 16B:
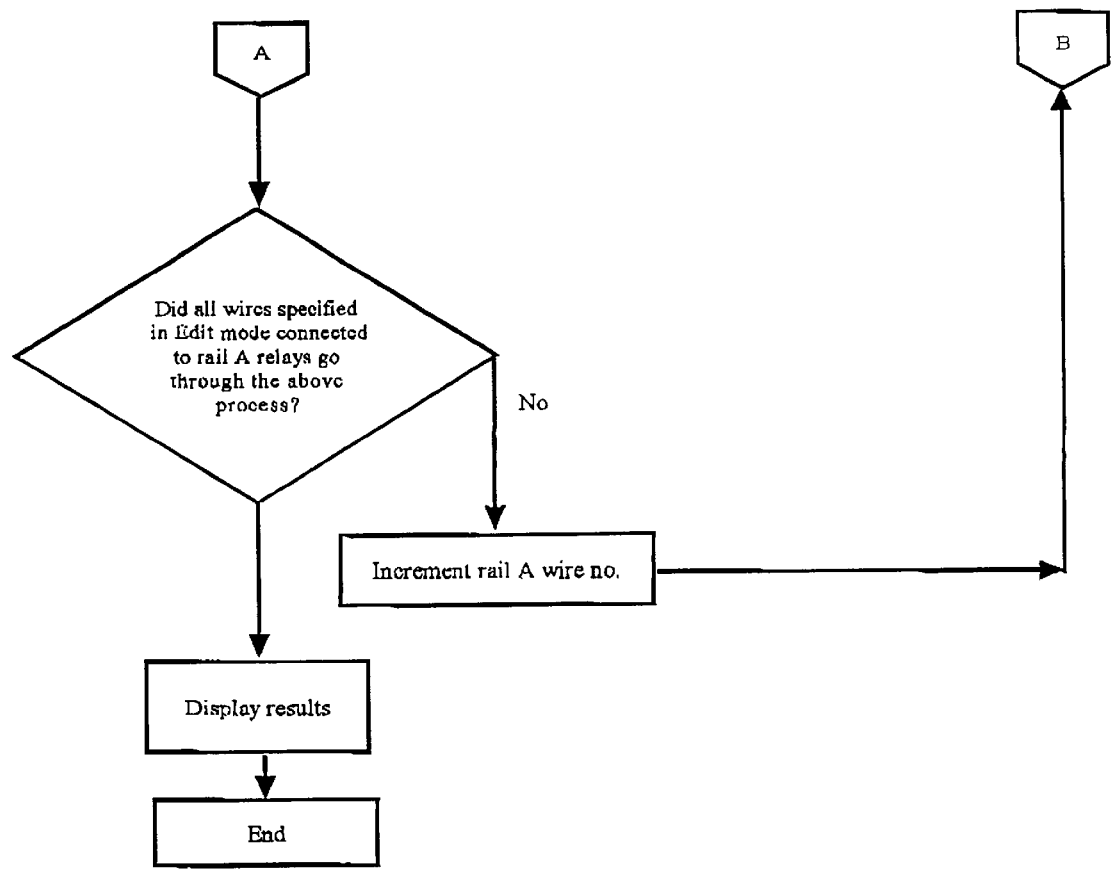

Referring to FIG. 16, the shorts/learn process begins with the software directing the CMC (22) to select the shorts mode. Second, the software directs the CMC (22) to select a relay on the rail A (16A) scanner card connected to a wire to be subjected to the shorts/learn process. Third, the software directs the CMC (22) to select a relay on rail B (16B) scanner card connected to a wire to be subjected to the shorts/learn process.

Fourth, the software asks if the rail A wire selected is the same as the rail B wire selected. If they are the same, the software directs the CMC (22) to increment the relay used on rail B (16B) scanner card. Fifth, the software directs the CMC (22) to measure for shorts between the selected relays on rail A and rail B. Sixth, the results of this shorts measurement is stored in the memory device. The third through sixth step is repeated with an incremental rail B wire number until all wires connected to rail B (16B) relays have been learned for shorts.

Seventh, the software displays the shorts/learn process results for each rail A (16A) relay upon the display screen (26). Eighth, the software asks if every rail A wire or each rail A wire specified by the user in edit mode has been subjected to the shorts/learn analysis. Steps two through eight are repeated until each rail A wire is subjected to the shorts/learn process. Ninth, results for every rail A wire or each one selected by the user in edit mode (see Figure ??) to be learned are displayed upon the display screen (26).

Figure 17A:
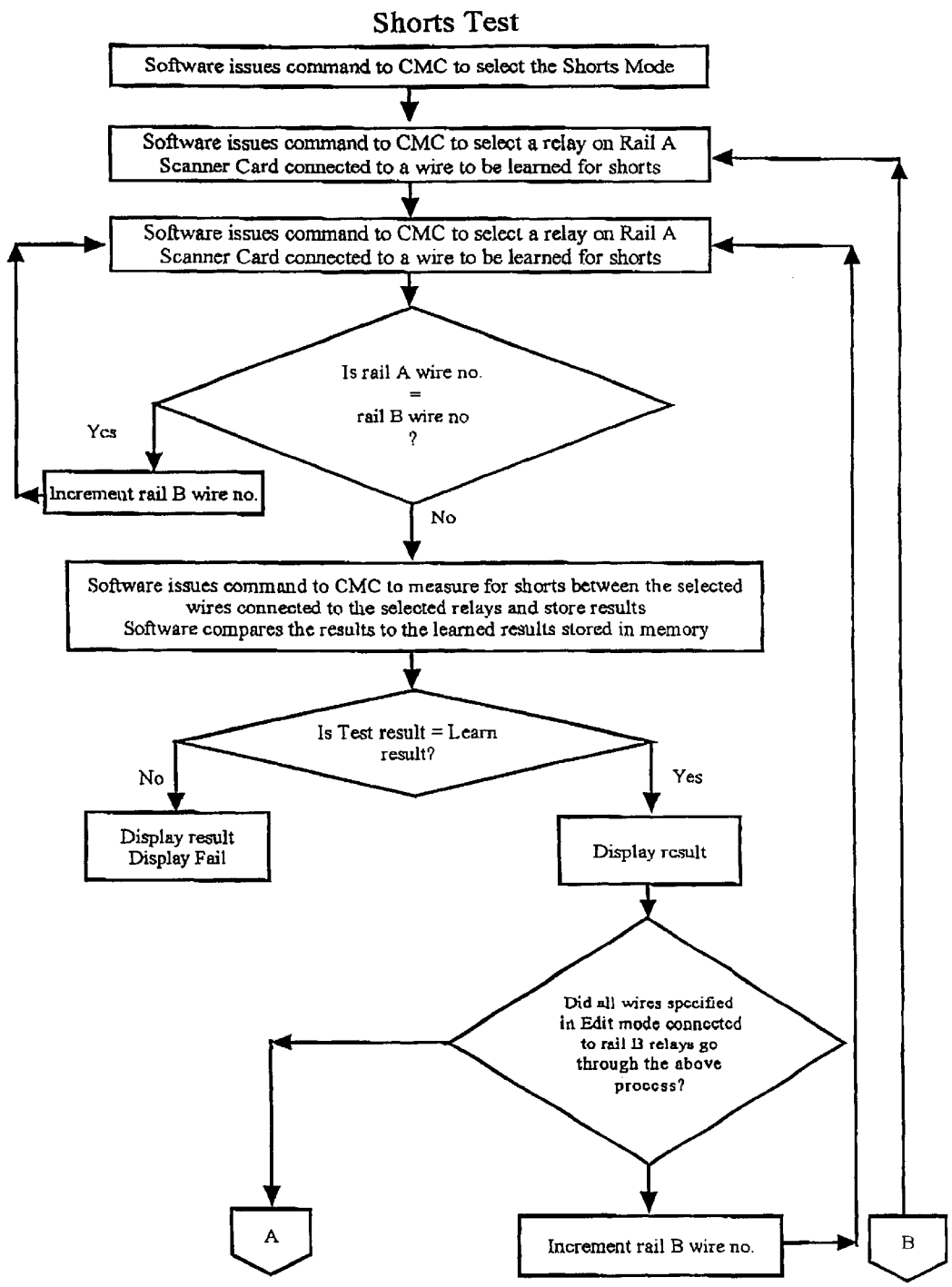
FIG. 17A and FIG. 17B is a flowchart illustrating the steps of the shorts test process of the present invention.
Figure 17B:
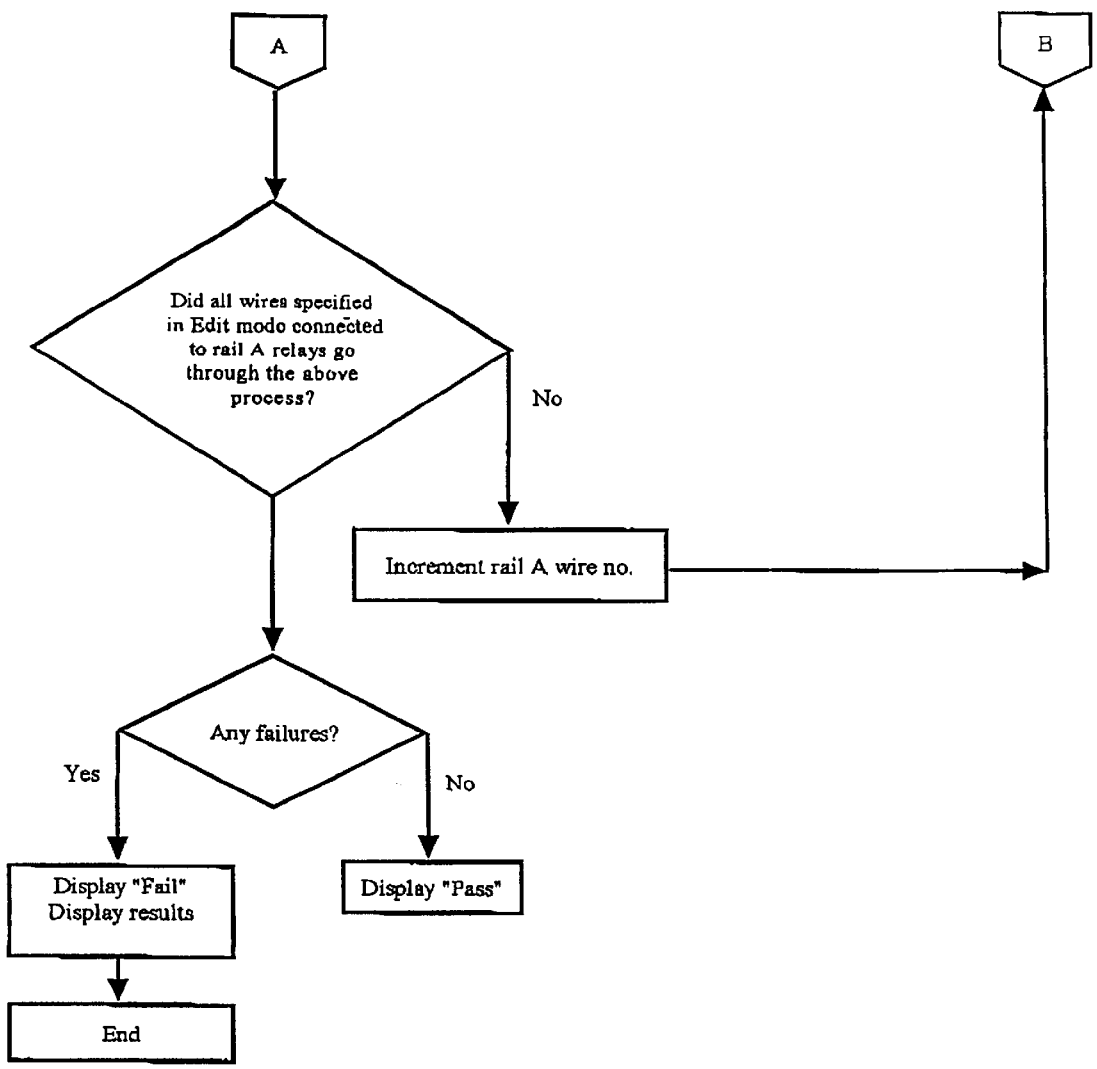

A flowchart illustrating the shorts/test process is shown in FIG. 17. The process for shorts/test is identical to the shorts/learn process except that after the fifth step, the software compares the shorts/learned results stored in the memory device (26) against the results of the shorts/test process. The software asks if the shorts/test data is equal to the shorts/learn data. This process is repeated until every wire in the rail A (16A) relay or every wire in relay A specified by the user while using the Edit mode (see FIG. 11) of the present invention is tested.

The software will display "pass" upon the display screen (26) if the test results for the particular wire are equal to the shorts/learn results and "fail" if they are not equal. The exact readings are displayed upon the display screen (26) regardless of whether the test passes or fails. This process is repeated until every wire in the rail A (16A) relay or every wire in relay A specified by the user while using the Edit mode of the present invention is tested.

Show Location

Figure 18:
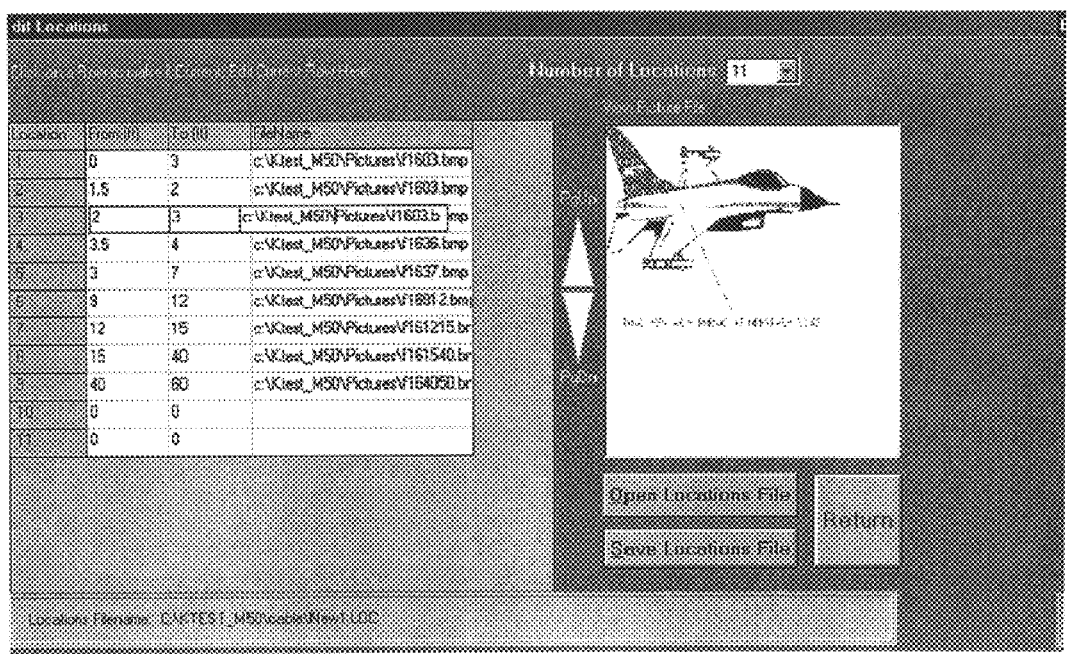
FIG. 18 is the saved files list screen shown upon the display screen of the present invention.

The present invention allows the user to save picture files which illustrate the structure of an aircraft or any other machine containing wiring. In addition, the present invention is capable of showing an illustration of the cable or wiring harness being tested upon previously saved picture files showing the aircraft's structure. FIG. 18 illustrates the display screen (26) having a list of previously saved files showing various portions of an aircraft. These previously saved files are directed to be taken from the memory device (24) and placed upon the display screen by the software via the show location function. The stored results showing the suspected wire, the type of fault present, and the location of the fault are then superimposed upon the previously saved files. The result is a visual representation of the specific area of the aircraft that a repair operator needs to conduct repairs, as shown in FIG. 18.

Figure 19:
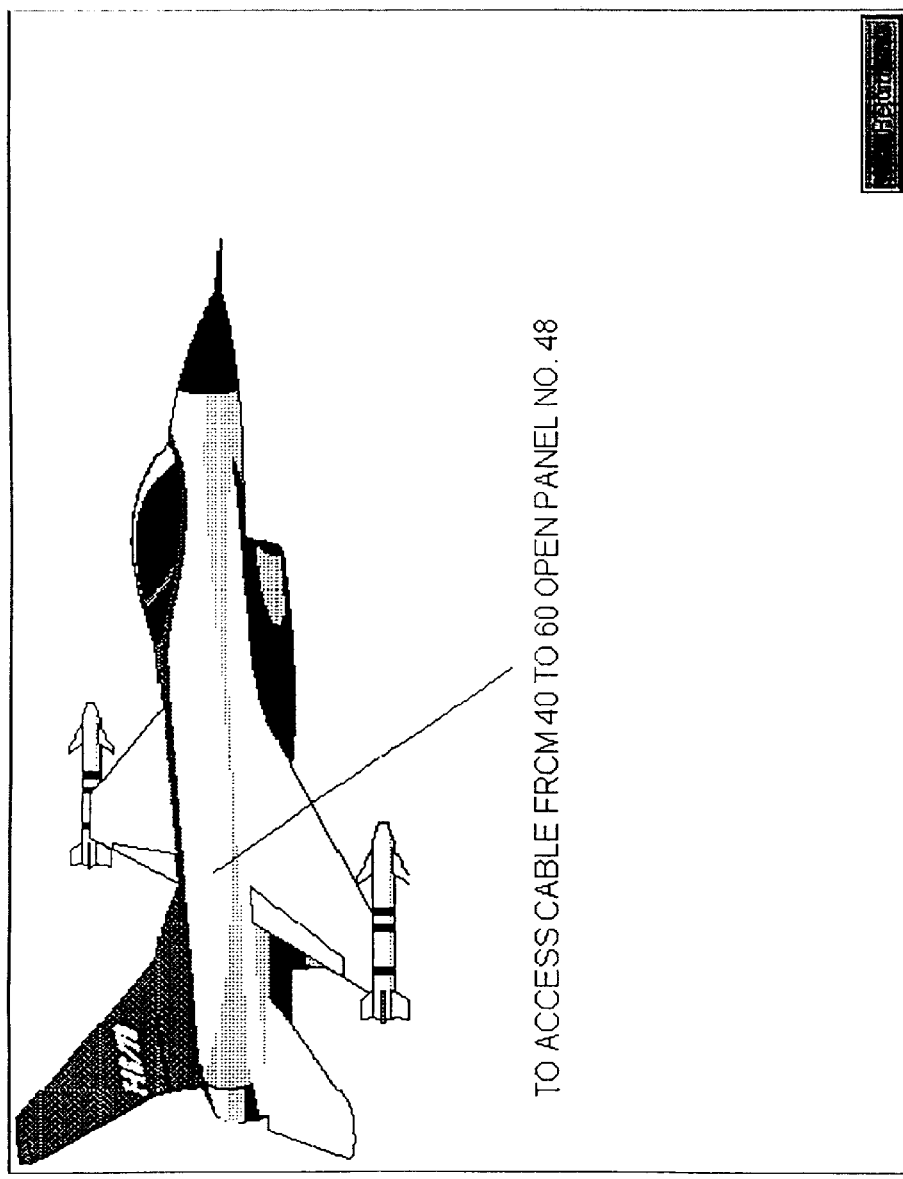
FIG. 19 is the show location screen shown upon the display screen of the present invention.
Figure 20:
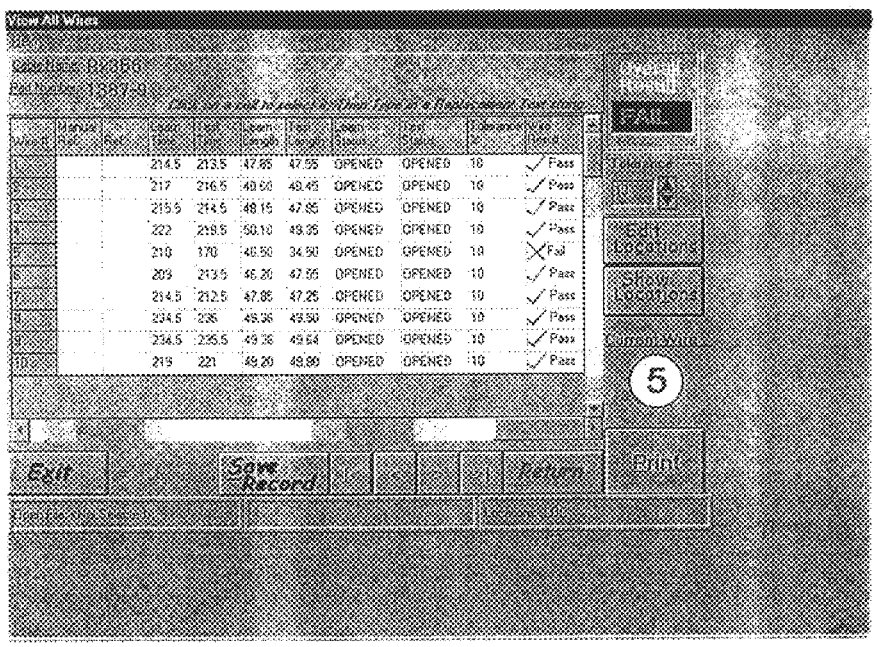
FIG. 20 is the view all screen shown upon the display screen of the present invention.

Repair instructions may also be inputted by the user into the testing unit (10). These instructions provide specific details concerning every aspect of the aircraft that a repair technician would need to know to effectuate the proper repair. The show location function of the software of the present invention provides for this repair information to be provided along with a visual display upon the display screen (26) as shown in FIG. 19.

Self Test

The present invention includes a selftest feature which provides a test of the internal circuitry of the testing unit. This feature is activated by the click of a button by the user and ensures reliability of the testing unit.

View All

The present invention provides a "view all" function. This function allows the user to observe an organized table of all data that has been assimilated by the testing unit. Accessing the view all table is as easy as clicking the view all button located at the bottom of the edit, learn, and test screens.

Although the invention has been described with reference to specific embodiments, this description is not meant to be construed in a limited sense. Various modifications of the disclosed embodiments, as well as alternative embodiments of the inventions will become apparent to persons skilled in the art upon the references to the description of the invention.

I claim:

1. An apparatus used to investigate the integrity of test cables and wiring harnesses, comprising;
   a testing unit, said unit further comprising:
      a central processing unit (CPU);
      at least one bus coupled to said CPU;
      at least one memory device coupled to said CPU;
      an input source coupled to said CPU;
      at least one control/measurement card (CMC) coupled to said CPU;
      at least one set of scanner cards coupled to said CMC, each set having a rail A scanner card and a rail B scanner card, each said set of scanner cards having a scanner port; said rail A and said rail B having a plurality of relays that connect to individual wires within said cables and wiring harnesses;
      at least one scope card coupled to said CPU;
      a visual display screen coupled to said CPU;
   a generic interface cable having a first and a second end, a interface harness extending an entire length of said interface cable, said first end of said interface cable having a test connector attached thereto, said second end of said interface cable having an interface connector attached thereto for connection to said test cables or said wiring harnesses, said first end of said interface cable coupled to said set of scanner cards at said scanner port.

2. The apparatus of claim 1, wherein said testing unit further comprises a modem card coupled to said CPU.

3. The apparatus of claim 1, wherein said testing unit further comprises a camera attachment coupled to said CPU.

4. The apparatus of claim 1, wherein said interface connector of said interface cable is custom designed.

5. The apparatus of claim 1, wherein said interface connector of said interface cable is open-ended.

6. The apparatus of claim 5, wherein said interface connector of said interface cable is terminated with a plurality of male or female pins.

7. The apparatus of claim 1, wherein said input source is a keyboard.

8. The apparatus of claim 1, wherein said input source is a mouse.

9. A method used for examination of cables and wiring harnesses, comprising the steps of:
   a. providing a testing unit, said unit further comprising:
      a central processing unit (CPU);
      at least one bus coupled to said CPU;
      at least one memory device coupled to said CPU;
      an input source coupled to said CPU;
      at least one control/measurement card (CMC) coupled to said CPU;
      at least one set of scanner cards coupled to said CPU, each set having a rail A scanner card and a rail B scanner card, each said set of scanner cards having a scanner port; said rail A and said rail B having a plurality of relays that connect to individual wires within said cables and wiring harnesses;
      at least one scope card coupled to said CPU;
      a plurality of attachment ports coupled to said CPU;
      a visual display screen coupled to said CPU;
   b. further providing an interface cable, said interface cable comprising;
      a first and a second end, an interface harness extending an entire length of said interface cable, said first end of said interface cable having a test connector attached thereto, said second end of said interface cable having an interface connector attached thereto for connection to said test cables or said wiring harnesses, said first end of said interface cable coupled to said set of scanner cards at said scanner port;

c. attaching selected cables or wiring harnesses to said interface connector of said second end of said interface cable;

d. attaching said test connector of said first end of said interface cable to said scanner port of said testing unit;

e. activating said testing unit to send signals through said cables or harnesses;

f. selecting a relay on said rail A;

g. selecting a relay on said rail B;

h. incrementing said relay selected on said rail B of said scanner card set if said relay selected on said relay B is the same as said relay selected on relay A;

i. sending an electronic pulse through selected relay on said rail A;

j. measuring capacitance between said selected relay on rail A and said selected relay on rail B;

k. storing said capacitance within said memory device;

l. measuring amplitude of said electronic pulse reflected to said relay A;

m. storing amplitude of said electronic pulse reflected to said relay A within said memory device;

n. repeating steps f. through m. until each of said plurality of relays on rail B have conducted said electronic pulse;

o. assigning two of said rail B relays having highest of said amplitudes and highest of said capacitances as return relays for the selected relay of said rail A;

p. repeating steps f. through o. until each of said plurality of relays on rail A have been assigned a return relay;

q. displaying each of said assignments of said rail B relays as return relays for each of said rail A relays upon said display screen;

r. sending a test pulse through said interface cable to obtain a test reading in said testing unit.

10. The method of claim 9, wherein said test reading obtained in step r. is selected from the group consisting of: learn, test, connectivity learn, connectivity test, ohmmeter test, shorts/learn and shorts/test.

* * * * *